(12) United States Patent
Kono

(10) Patent No.: US 6,314,028 B1
(45) Date of Patent: Nov. 6, 2001

(54) SEMICONDUCTOR MEMORY DEVICE CAPABLE OF STABLE SENSING OPERATION

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/755,246

(22) Filed: Jan. 8, 2001

(30) Foreign Application Priority Data

Jul. 7, 2000 (JP) .................................................. 12-206786

(51) Int. Cl.[7] .................................................... G11C 7/00
(52) U.S. Cl. ..................... 365/189.09; 365/205; 365/226
(58) Field of Search ......................... 365/189.09, 189.11, 365/205, 207, 208, 226, 149

(56) References Cited

U.S. PATENT DOCUMENTS

| 5,687,123 | 11/1997 | Hidaka et al. .................. 365/189.09 |
| 6,081,443 | * 6/2000 | Morishita et al. ................... 365/149 |
| 6,198,677 | * 3/2001 | Hsu et al. .............................. 365/203 |
| 6,201,728 | * 3/2001 | Narui et al. ........................... 365/149 |
| 6,205,068 | * 3/2001 | Yoon .................................... 365/203 |

OTHER PUBLICATIONS

"A Precharged–Capacitor–Assisted Sensing (PCAS) Scheme with Novel Level Controller for Low Power DRAMs", T. Kono et al., 1999 Symposium on VLSI Circuits Digest of Technical Papers, pp. 123–124.

"An Experimental 256–MB DRAM with Boosted Sense–Ground Scheme", M. Asakura, et al. IEEE Journal of Solid–State Circuits, vol. 29, No. 11, Nov. 1994, pp. 1302–1309.

* cited by examiner

Primary Examiner—Son Mai
(74) Attorney, Agent, or Firm—McDermott, Will & Emery

(57) ABSTRACT

The amount of charge supplied to a high level sense power supply line by a level control circuit is monitored. Charge of an equal amount is drawn out from a low level sense power supply line according to the monitoring result. In a memory of a boosted sense ground scheme, the boosted sense ground voltage can be maintained at a predetermined voltage level stably.

20 Claims, 20 Drawing Sheets

6aa: CONSTANT CURRENT GENERATION CIRCUIT
6ab: OUTPUT CIRCUIT
6a

6ba: COMPARISON CIRCUIT
6bb: DRIVER
6b

SEMICONDUCTOR MEMORY DEVICE CAPABLE OF STABLE SENSING OPERATION

BACKGROUND OF THE INVENTION

1. Field of the Invention

The present invention relates to semiconductor memory devices, particularly to a dynamic semiconductor memory device with a sense amplifier circuit that differentially amplifies data in memory cells. More particularly, the present invention relates to a structure of a sense power supply circuit generating a power supply voltage of a sense amplifier circuit.

2. Description of the Background Art

In accordance with the development of recent computers and information processing terminals, the demand placed on devices employed as the main storage in these equipment has become higher. More specifically, there is an increasing not only for large storage capacity, but also for increasing the effective data transfer rate and lowering power consumption to allow usage of a large storage capacity memory in portable apparatuses. As to a DRAM (dynamic random access memory) widely used as the main memory device, a SDRAM that carries out data input/output in synchronization with clock signals (clock synchronous type DRAM), a DDR (double data rate) SDRAM that carries out data input/output in synchronization with both the rising and falling edges of clock signals, and the like, typical of a DRAM that allows data to be transferred at high speed, are beginning to be employed widely.

In a DRAM, information is stored in the form of electrical charges in a capacitor of a memory cell. Since data of a H (high) level written into a DRAM cell will be naturally lost by leakage current when left intact, a data re-write operation called "refresh" must be carried out periodically.

In recent DRAMs, an operation called self refresh is defined by specification. In a self refresh operation mode, a refresh timing is set automatically by a timer provided in the DRAM. A refresh operation is carried out automatically at the set refresh timing. The self refresh operation is carried out during a standby state in which the DRAM is not accessed. By suppressing the self refresh current consumed during this self refresh operation, the current consumption of the DRAM can be reduced to increase the continuous operative period of time of, for example, portable communication information terminals (by virtue of increase of the battery lifetime).

The basic factors determining the value of the self refresh current depend on the bit line potential amplitude, the bit line load and the refresh cycle. The refresh cycle is closely related to the data retaining ability of the memory cell. A longer refresh cycle can be set as the data retaining ability of the memory cell becomes higher. As a method of increasing the memory cell data retaining ability on a circuit basis, Asakura et al. has proposed the BSG (boosted sense ground) scheme. This BSG scheme is described in details in, for example, IEEE Journal of Solid-State Circuits 1994, pp.1303–1309. The principle of the BSG scheme will be described in the following.

FIG. 35 represents a structure of a memory cell array in a DRAM with the conventional BSG scheme. Referring to FIG. 35, the DRAM includes memory cells MC arranged in a matrix of rows and columns, a pair of bit lines BL and ZBL arranged corresponding to each column, and a word line WL arranged corresponding to each row of memory cells MC. In FIG. 35, one memory cell MC is depicted as a representative. Memory cell MC includes a memory cell capacitor Cs to store information, and an access transistor MT formed of an N channel MOS transistor (insulation gate field effect transistor) and rendered conductive in response to a signal voltage on word line WL to connect memory cell capacitor Cs to bit line BL. Each of bit lines BL and ZBL has a parasitic capacitance (bit line capacitance) Cb.

Bit lines BL and ZBL are provided with a bit line equalize/precharge circuit E/P precharging and equalizing bit lines BL and ZBL to an intermediate voltage Vble in response to a bit line equalize designation signal BLEQ, and a sense amplifier circuit S/A amplifying the voltage difference of bit lines BL and ZBL in response to sense amplifier activation signals SON and ZSOP.

Bit line equalize/precharge circuit E/P includes precharge transistors TQ7 and TQ8 transmitting intermediate voltage Vble to respective bit lines BL and ZBL in response to bit line equalize designation signal BLEQ, and an equalize transistor TQ9 electrically short-circuiting bit lines BL and /BL in response to bit line equalize designation signal BLEQ. Transistors TQ7–TQ9 are formed of N channel MOS transistors. Intermediate voltage Vble is equal to the voltage level of the intermediate value between a sense power supply voltage Vdds and a voltage Vbsg higher than ground voltage GND, i.e. (Vdds+Vbsg)/2.

Sense amplifier circuit S/A includes an N sense amplifier rendered active, when sense amplifier activation signal SON is active, to discharge one of bit lines BL and /BL of the lower potential, and a P sense amplifier rendered active, when sense amplifier activation signal ZSOP is active, to charge another of bit lines BL and /BL of the higher potential. The N sense amplifier includes: an N channel MOS transistor TQ1 having a drain connected to bit line BL and a gate connected to bit line /BL, an N channel MOS transistor TQ2 having a drain connected to bit line /BL and a gate connected to bit line BL, and an N channel MOS transistor TQ3 rendered conductive, when sense amplifier activation signal SON is active, to transmit sense power source voltage Vsan (=Vbsg) to the sources of MOS transistors TQ1 and TQ2. In the BSG scheme, sense power source voltage Vsan is set to the level of a boosted voltage Vbsg higher than ground voltage GND.

The P sense amplifier includes a P channel MOS transistor TQ4 having a drain connected to bit line BL and a gate connected to bit line /BL, a P channel MOS transistor TQ5 having a drain connected to bit line /BL and a gate connected to bit line BL, and a P channel MOS transistor TQ6 rendered conductive when sense amplifier activation signal ZSOP is active to transmit sense power supply voltage Vsap to the sources of MOS transistors TQ4 and TQ5. Sense power supply voltage Vsap corresponds to the level of sense power supply voltage Vdds. The refresh operation of memory cell MC will now be described with reference to the signal waveform diagram of FIG. 36.

In a standby state, sense amplifier activation signal SON is at an L level of ground voltage GND, and sense amplifier activation signal ZSOP is at an H level of sense power supply voltage Vdds. Sense amplifier circuit S/A is in an inactive state. Bit line equalize designation signal BLEQ is at an active state of an H level. MOS transistors TQ7–TQ9 included in bit line equalize/precharge circuit E/P all stay in a conductive state. Bit lines BL and /BL are precharged and equalized to the level of intermediate voltage Vble. Word line WL is at the level of ground voltage GND. Access transistor MT of memory cell MC maintains a non-conductive state.

Upon access to a memory cell (starting of a refresh cycle), bit line equalize designation signal BLEQ is pulled down to an L level. Bit line equalize/precharge circuit E/P is rendered inactive. Bit lines BL and ZBL attain a floating state at the level of intermediate voltage Vble.

By a row select circuit not shown, word line WL is driven to a selected state according to an address signal, whereby the voltage level of word line WL rises. When the voltage level of word line WL becomes higher than the voltage level of bit line BL by the threshold voltage of the access transistor, access transistor MT is rendered conductive, whereby charge is transferred between bit line BL and memory cell capacitor Cs. FIG. 36 represents an operation waveform when memory cell MC stores data of an H level, and the voltage level of bit line BL rises.

Since bit line ZBL does not have a memory cell connected thereto, bit line ZBL maintains the level of intermediate voltage Vble.

When the voltage difference between bit lines BL and ZBL becomes large enough, sense amplifier activation signals SON and ZSOP are rendered active. In response to sense amplifier activation signal SON attaining an H level of an active state, MOS transistor TQ3 in sense amplifier circuit S/A conducts. Sense power source voltage Vsan is transmitted to the sources of MOS transistors TQ1 and TQ2. The N sense amplifier is rendered active, and bit line ZBL of the lower potential is discharged to the level of sense power source voltage Vsan (=Vbsg). In the case sense amplifier activation signal ZSOP is rendered active to attain an L level, MOS transistor TQ6 in sense amplifier circuit S/A is rendered conductive. Sense power supply voltage Vsap is transmitted to the sources of MOS transistors TQ4 and TQ5. The P sense amplifier is rendered active. By this P sense amplifier, bit line BL of the higher potential is charged to the level of sense power supply voltage Vsap (=Vdds).

Word line WL is at the level of high voltage Vpp higher than sense power supply voltage Vdds. Therefore, the H level data corresponding to the level of sense power supply voltage Vdds on bit line BL is transmitted to memory cell capacitor Cs impervious to the loss of the threshold voltage at access transistor MT. Thus, the H level data rewrite and refresh operation of memory cell MC is completed. In the case where memory cell MC stores data of an L level, a similar refresh operation is carried out in which a voltage of a level corresponding to sense power source voltage Vsan (=Vbsg) is transmitted to memory cell capacitor Cs. As to the voltage level of the data stored in a memory cell, the voltage level of H data is equal to the level of sense power supply voltage Vdds, whereas the voltage level of L data is equal to the voltage level of sense power source voltage Vsan (Vbsg).

When the refresh cycle is completed, word line WL is driven to a non-selected state. Then, sense amplifier activation signals SON and ZSOP are rendered inactive sequentially. As a result, the refreshed data is stored in memory cell MC. Then, bit line equalize designation signal BLEQ is rendered active at an H level, whereby bit line equalize/precharge circuit E/P becomes active. Bit line BL and ZBL are precharged and equalized to the level of intermediate voltage Vble.

In the BSG scheme, sense power source voltage Vsan is set to the level of a voltage Vbsg that is higher than ground voltage GND. The advantage of setting sense power source voltage Vsan to a level higher than ground voltage GND in the BSG scheme will be described briefly in the following.

FIG. 37 schematically shows a structure of a cross section of memory cell MC. Referring to FIG. 37, memory cell MC includes N type impurity regions 502a and 502b of high concentration formed spaced apart at the surface of a semiconductor substrate, a conductive layer 504 formed on a channel region between impurity regions 502a and 502b with a gate insulation film 503 laid thereunder, and a conductive layer 505 electrically connected to impurity region 502a. Two layers of interlayer insulation films 506a and 506b are formed on conductive layers 504 and 505. Conductive layer 504 corresponds to word line WL, whereas conductive layer 505 corresponds to bit line BL.

Memory cell MC further includes a conductive layer 510 electrically connected to impurity region 502b via a contact hole formed in interlayer insulation films 506a and 506b, and a conductive layer 514 laid above conductive layer 510. Conductive layer 510 is formed so that the cross section of the upper portion has a U shape. Conductive layer 514 includes a protrusion 514a extending into the U shape via capacitor insulation film 512 at a region above conductive layer 510. Conductive layer 510 functions as a connection node connecting access transistor MT and memory cell capacitor Cs, i.e. a storage node SN. Memory cell capacitor Cs is formed at a region where conductive layer 510 faces conductive layer 514 via capacitor insulation film 512.

Although memory cell MC has a stacked capacitor structure in FIG. 37, this stacked capacitor may have another structure such as a cylindrical shape, fin shape, cross sectional T shape structures, or the like.

Consider the state where word line WL is held at the level of ground voltage GND, intermediate voltage Vble is applied to bit line BL, and storage node SN retains a voltage Vch corresponding to an H level data in memory cell MC of FIG. 37. A cell plate voltage Vcp (Vbsg+Vdds)/2) is applied to conductive layer 514 functioning as a cell plate electrode layer CP.

The main leakage sources in memory cell MC are (1) a leakage current Ils flowing towards a P substrate 500 via the PN junction between impurity region 502b of memory cell capacitor Cs and P type substrate (P type semiconductor substrate) 500, and (2) a leakage current Ilb towards bit line BL determined by the sub threshold characteristic of the access transistor.

The magnitude of leakage current Ils towards P type substrate 500 depends upon a voltage difference Vpn applied across the PN junction between impurity region 502b and P type substrate 500. The leakage current Ils becomes greater as voltage difference Vpn becomes larger. In FIG. 37, the voltage of storage node SN is a voltage Vch corresponding to H level data. Since bias voltage Vbb is applied to P type substrate 500, voltage difference Vpn is represented by the following equation.

$$Vpn = Vch - Vbb$$

Leakage current Ilb flowing towards bit line BL via the access transistor is represented by the following equation according to the difference between gate-source voltage Vgs and threshold voltage Vth of the access transistor.

$$Ilb = Ilb0 \cdot 10^{\wedge}(Vgs-Vth)/S \tag{1}$$

where "^" represents the exponentiation. In equation (1), Ilb0 is the current value defining threshold voltage Vth, and S is a coefficient determined depending upon the transistor structure and process, represented by dVgs/d log Id. Here, Id represents a drain current.

In equation (1), it seems that leakage current Ilb does not depend upon voltage Vbl of bit line BL to which the access transistor is connected. However, threshold voltage Vth depends upon the substrate-source voltage of Vbs=Vbb−Vbl. Therefore, the absolute value of substrate-source voltage Vbs becomes smaller as the bit line voltage, i.e., source voltage Vbl is lower to result in a smaller threshold voltage Vth.

For example, in the case where a corresponding bit line BL of the memory cell connected to a non-selected word line is at a voltage level corresponding to L level data (in the conventional case, bit line voltage Vbl is equal to ground voltage GND) in the memory block to be refreshed, the access transistor of the memory cell connected to this non-selected word line has a smaller absolute value of substrate-source voltage Vbs even if word line WL is at the level of ground voltage GND. Therefore, bit line leakage current Ilb becomes greater. As appreciated from equation (1), even if threshold voltage Vth slightly varies by 0.1 V, bit line leakage current Ilb varies approximately ten times as large since the S factor is approximately 0.1 V.

In order to suppress bit line leakage current Ilb, the approach of setting the substrate bias voltage Vbb applied to P type substrate 500 to a negative voltage can be considered as shown in FIG. 38A. By setting substrate bias voltage Vbb to a deep bias voltage in the negative direction, the absolute value of the substrate-source voltage Vbs can be increased, which in turn allows a larger threshold voltage Vth to suppress bit line leakage current Ilb. However, the voltage difference Vpn applied across the PN junction between impurity region 502b and P type substrate 500 becomes greater to increase substrate leakage current Ils. Sense power supply voltage Vdds determines the level of voltage Vch corresponding to H level data of storage node SN. If sense power supply voltage Vdds is reduced where substrate leakage current Ils increases by this substrate bias deep in the negative direction, it will become difficult to retain the H level data for a long period of time. The BSG scheme provides the following advantages.

(a) As shown in FIG. 38B, back gate bias voltage (bias voltage Vbb of the P type substrate) is set to the level of ground voltage GND, whereas a positive voltage Vbsg is applied, as a voltage corresponding to L level data, to bit line BL (or ZBL). Word line WL is at the level of ground voltage GND when kept in a non-selected state. Therefore, gate-source voltage Vgs of access transistor MT becomes a negative voltage of −Vbsg.

In other words, gate-source voltage Vgs of access transistor MT can be set negative even if a negative voltage is not applied to P type substrate 500. Also, the voltage Vbs applied to the PN junction between source impurity region 502a of access transistor MT and P type substrate 500 of this access transistor MT can be kept negative without negative substrate voltage Vbb. As a result, negative value of Vgs and Vbs suppresses the leakage current Ilb.

(b) Since ground voltage GND is applied to P type substrate 500, voltage difference Vpn applied across the PN junction between impurity region 502b and P type substrate 500 at storage node SN becomes equal to voltage Vch of H level data. The voltage difference applied across the PN junction of the storage node can be reduced by the change of the substrate voltage from the negative voltage to the ground voltage. In response, substrate leakage current Ils flowing via the PN junction of storage node SN can be reduced.

(c) The precharge voltage of bit line BL must be ½ times the bit line potential amplitude. Therefore, bit line precharge voltage (intermediate voltage) Vble becomes Vdds/2+Vbsg/2, as shown in FIG. 36. Since this precharge voltage is charged up to the level of sense power supply voltage Vdds, bit line amplitude dVbl can be reduced by Vbsg/2 in comparison to the structure where the bit line is driven to the level of ground voltage GND.

By the above (a) and (b), the refresh interval can be set longer since the speed of losing H level data is alleviated. In addition, by the above (c), current consumption during sense operation can be reduced.

Thus, the BSG scheme has the advantage of reducing the sense current and improving the refresh characteristics. Bias voltage Vbb applied to the substrate region of the access transistor, i.e. to the back gate thereof is equal to ground voltage GND. It is not necessary to apply a negative bias voltage, so that the circuit configuration can be simplified. However, the L level voltage (=Vbsg) of the bit line BL is higher than ground voltage GND by approximately 0.4–0.5 V. The bit line precharged to the level of the intermediate voltage must be discharged and is held at the level of voltage Vbsg. If a diode-connected P-channel MOS transistor is employed for generating such a low level positive voltage as the sense boosted sense ground voltage, it is difficult to generate a stable bit line boosted sense ground voltage Vbsg due to a disadvantageous factor of the P-MOS transistor, such as variation in threshold voltage and temperature dependency.

A large bit line discharging current will be conducted immediately after the sense amplifier circuit is rendered active and a sensing operation is started. In order to suppress the influence by this bit line discharging current to prevent transient variation of the boosted sense ground voltage Vbsg, an extremely high current drivability and also the ability to maintain the voltage level stably are required for the circuit that generates the boosted sense ground voltage Vbsg. Therefore, the BSG scheme has the technical subject of generating and supplying a boosted sense ground voltage Vbsg always stably as a sense ground voltage, covering the transient variation problem.

To solve such problems in the BSG scheme, Kono et al. propose a novel sense scheme of "A Precharged-Capacitor-Assisted Sensing (PCAS) Scheme with Novel Level Controller for Low Power DRAMs" in 1999 Symposium on VLSI Circuits, Digest of Technical Papers, pp.123–124. This PCAS scheme generates a boosted sense ground voltage Vbsg at an accurate voltage level on bit line BL or ZBL by precharging the decouple capacitance in advance in accordance with the bit line charging/discharging charge that is required in a sensing operation, followed by coupling the decouple capacitance with the sense power supply line/sense ground line in the sense amplifier circuit operation mode. Reduction of the absolute value of gate-source voltage Vgs of the MOS transistor in the sense amplifier circuit caused by voltage variation in the sense power supply line/sense ground line can be prevented to speed up the sensing operation.

It is to be noted that variation of the level of boosted sense ground voltage Vbsg occurs, not only in the sense period where the sense amplifier circuit operates, but also in the period when the sense amplifier circuit corresponding to the selected column is coupled to an internal data line. More specifically, the internal data line pair is generally precharged to an H level, so that charge flows into the sense amplifier circuit and the bit line pair by the precharge voltage of the internal data line when they are coupled. As a result, the level of boosted sense ground voltage Vbsg changes.

In the case of the above PCAS scheme, booted sense ground voltage Vbsg can be accurately generated after the period of the sensing operation. As to stabilization of boosted sense ground voltage Vbsg in writing/reading data, voltage variation on the sense power supply line and sense ground line can be suppressed to some extent since the decouple capacitance is coupled to the sense power supply line/sense ground line during the activation period of the sense amplifier circuit. However, no particular consideration was made as to effective measures to stabilize the level of the boosted sense ground voltage in the writing/reading operation of data.

Particularly in the case where the level of boosted sense ground voltage Vbsg is increased in a data writing/reading operation mode, there is a possibility of degrading the stability of the sense amplifier circuit. There is also the possibility of causing a failure such as erroneous data readout since the L level data read out margin is lost due to increase of the voltage level of the L level data of a selected memory cell.

SUMMARY OF THE INVENTION

An object of the present invention is to provide a semiconductor memory device that can hold a power source voltage (including both high level power supply voltage and low level power supply voltage) of a sense amplifier circuit stably at a constant level.

Another object of the present invention is to provide a semiconductor memory device that can hold a power source voltage of a sense amplifier circuit stably both in a sensing operation mode and in a data access mode.

A further object of the present invention is to provide a semiconductor memory device that can generate a power source voltage of a sense amplifier circuit stably over the entire activation period of the sense amplifier circuit.

In a semiconductor memory device according to the present invention, the charge transfer amount of a first sense power source voltage supply line is monitored and causes charge transfer on a second sense power source voltage supply line according to the monitored result.

The transfer charge amount of the first sense power source voltage supply lines corresponds to the amount of charge consumed by the sense amplifier circuit. The charge used by the sense amplifier circuit is transmitted to the second sense power source voltage supply line. By producing the charge transfer amount corresponding to the charge transfer amount in the sense power supply circuit also at the second sense power source voltage supply line, the voltage level of the second sense power supply voltage of the second sense power source voltage supply line can be stabilized. Accordingly, the low level sense power supply voltage can be stabilized in a sensing operation mode or a data write/read mode even with a structure in which a boosted sense ground voltage is employed. Thus, a sensing operation and data write/read operation can be carried out at a high speed and correctly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
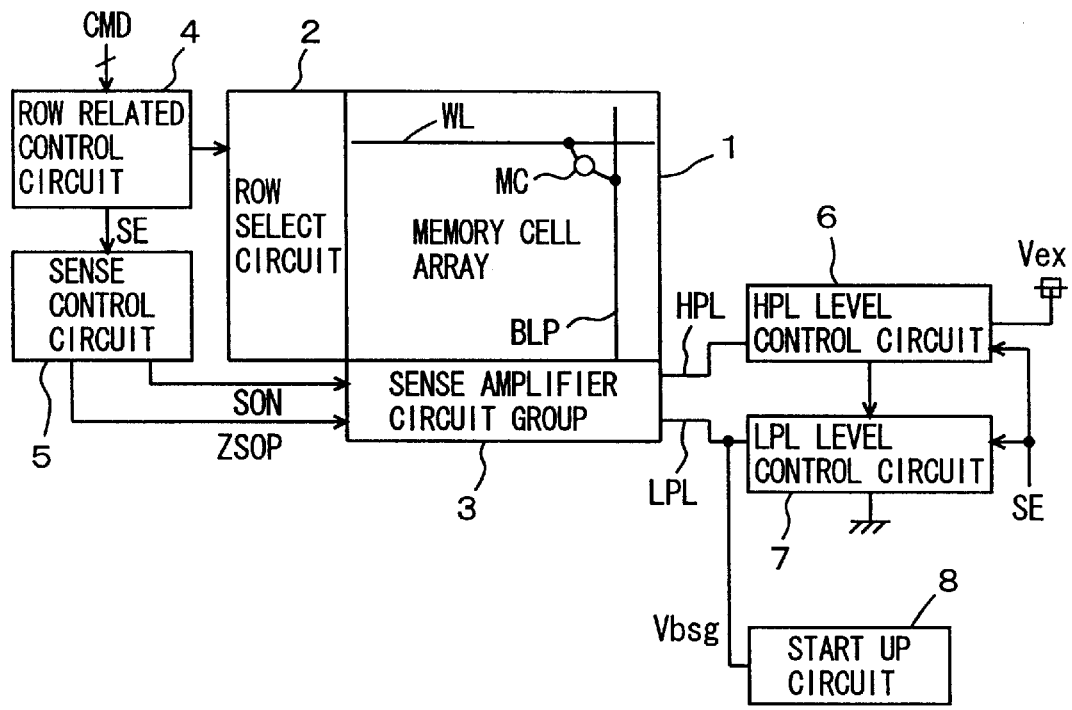
FIG. 1 schematically shows an entire structure of a semiconductor memory device according to a first embodiment of the present invention.

FIG. 1 schematically shows a structure of a main part of a semiconductor memory device according to a first embodiment of the present invention. Referring to FIG. 1, the semiconductor memory device includes a memory cell array 1 with a plurality of memory cells arranged in rows and columns. In memory cell array 1, a word line WL is arranged corresponding to each row of memory cells MC, and a bit line pair BLP is arranged corresponding to each column of memory cells MC.

The semiconductor memory device further includes a row select circuit 2 to drive a word line WL corresponding to an addressed row of memory cell array 1 to a selected state, a sense amplifier circuit group 3 having a sense amplifier circuit provided corresponding to bit line pair BLP of memory cell array 1 to amplify voltage difference of bit line pair BLP when active, a row related control circuit 4 controlling the operation of row select circuit 2 and rendering a sensing operation activation signal SE active in response to an externally applied operation mode designation signal (command) CMD, and a sense control circuit 5 responsive to activation of sensing operation activation signal SE from row related control circuit 4 to render sense amplifier activation signals SON and ZSOP active for application to sense amplifier circuit group 3. The sense amplifier circuit in sense amplifier circuit group 3 uses the voltages of sense power source voltage supply lines HPL and LPL as operating power supply voltages to amplify the voltage difference of a corresponding bit line pair BLP when sense amplifier activation signals SON and ZSOP are active.

The semiconductor memory device further includes an HPL level control circuit 6 adjusting the voltage level of a sense power source voltage supply line (referred to as "H level sense power supply line" hereinafter) HPL when sensing operation activation signal SE is active, and an LPL control circuit 7 monitoring the amount of charge supplied to high level sense power supply line HPL by HPL level control circuit 6 when sensing operation activation signal SE is active, and discharging an amount of charge according to the monitored charge amount from a sense power source voltage supply line (referred to as "low level sense power supply line" hereinafter) LPL. HPL level control circuit 6 generates and transmits a sense power supply voltage from an external power supply voltage Vex to high level sense power supply line HPL. A start up circuit 8 generating a boosted sense ground voltage Vbsg when power is turned on is coupled to low level sense power supply line LPL. At the time of power on and the like, low level sense power supply line LPL is charged up to the level of boosted sense ground voltage Vbsg higher than ground voltage GND prior to starting of a normal operation.

Figure 2:
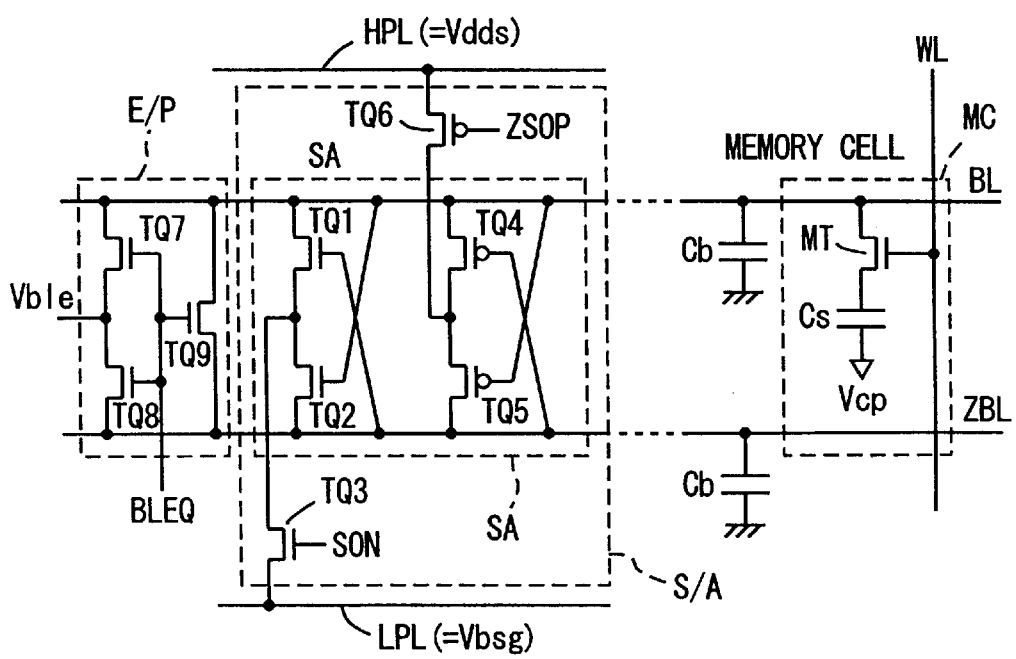
FIG. 2 shows a structure of a memory cell array and a sense amplifier circuit group of FIG. 1.

FIG. 2 shows a structure of memory cell array 1 and sense amplifier circuit group 3 of FIG. 1. In FIG. 2, the structure of a portion related to bit line pair BL and ZBL is shown representatively. Memory cell MC is arranged corresponding to a crossing of bit line BL and word line WL. A sense amplifier circuit S/A is arranged corresponding to bit line pair BL and ZBL. A bit line equalize/precharge circuit E/P that precharges and equalizes bit lines BL and ZBL to the level of intermediate voltage Vbl in response to activation of bit line equalize designation signal BLEQ is provided at bit lines BL and ZBL.

Figure 35:
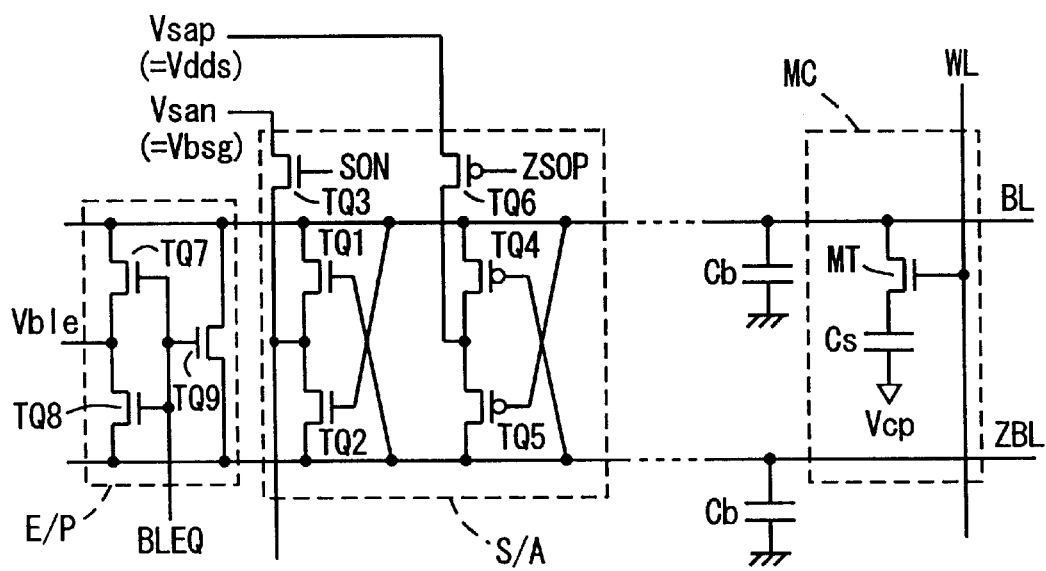
FIG. 35 schematically shows a structure of the memory array portion of a conventional semiconductor memory device.
Figure 36:
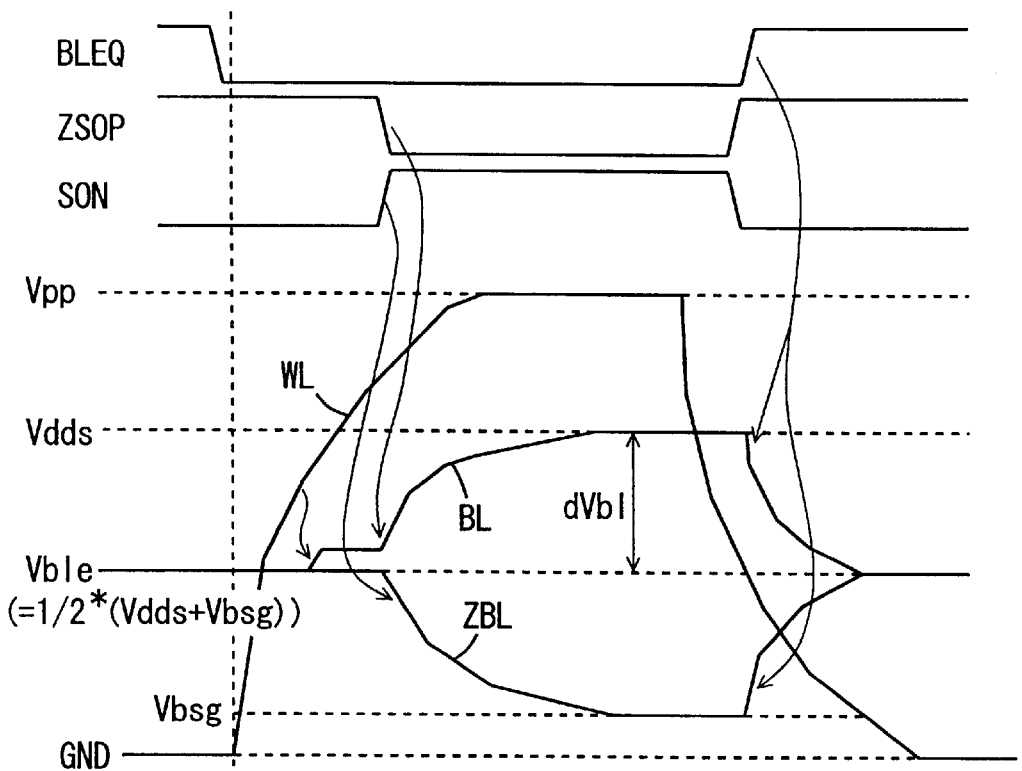
FIG. 36 is a signal waveform diagram representing the operation of the circuit of FIG. 35.
Figure 37:
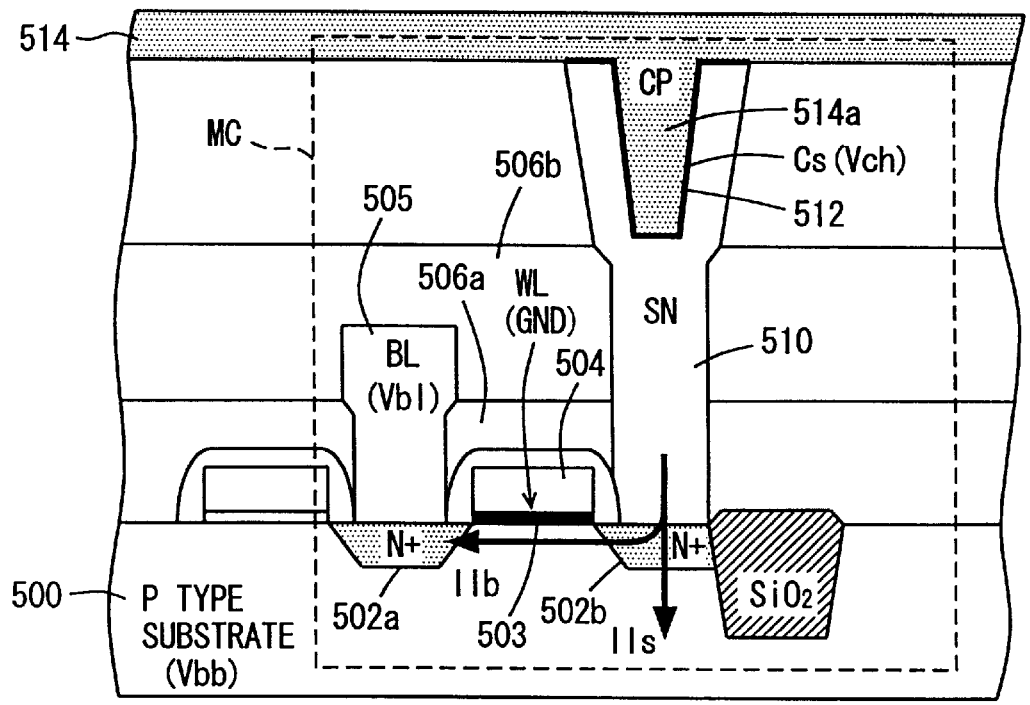
FIG. 37 schematically shows a sectional structure of a conventional memory cell.
Figure 38A:
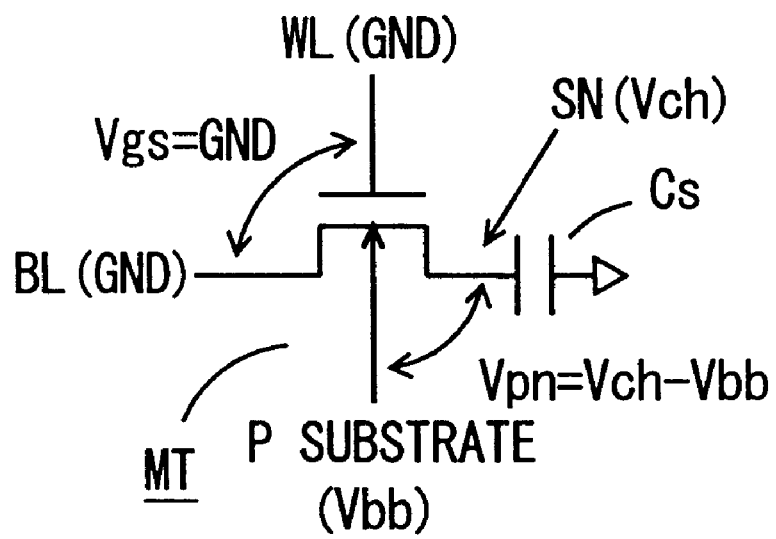
FIGS. 38A and 38B are diagrams representing the applied voltage of the access transistor of a non-selected memory cell.
Figure 38B:
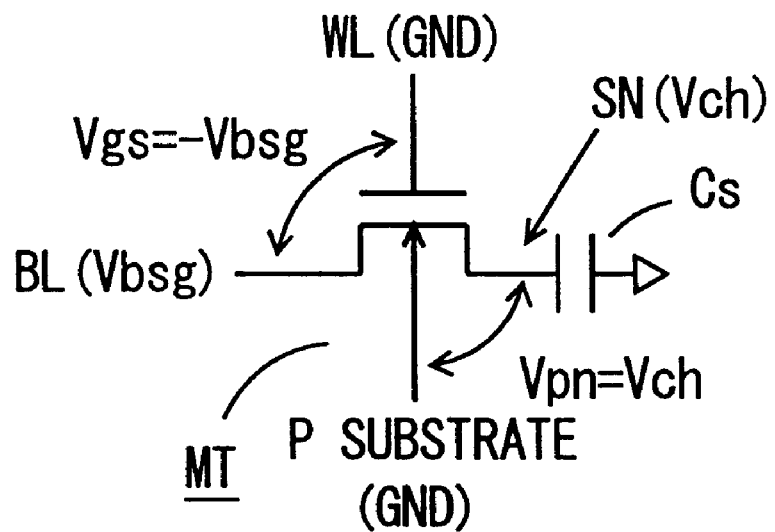

Similar to the conventional sense amplifier shown in FIG. 35, sense amplifier circuit S/A includes an N sense amplifier formed by N channel MOS transistors TQ1 and TQ2, and a P sense amplifier formed by P channel MOS transistors TQ4 and TQ5. A sense amplifier SA is formed by these P and N sense amplifiers.

Sense amplifier circuit S/A further includes a sense amplifier activation transistor (P channel MOS transistor) TQ6 coupling source nodes of MOS transistors TQ4 and TQ5 to high level sense power supply line HPL in response to activation of sense amplifier activation signal ZSOP, and a sense amplifier activation transistor (N channel MOS transistor) TQ3 rendered conductive in response to activation of sense amplifier activation signal SON to couple sources of MOS transistors TQ1 and TQ2 to low level sense power supply line LPL.

Figure 3:
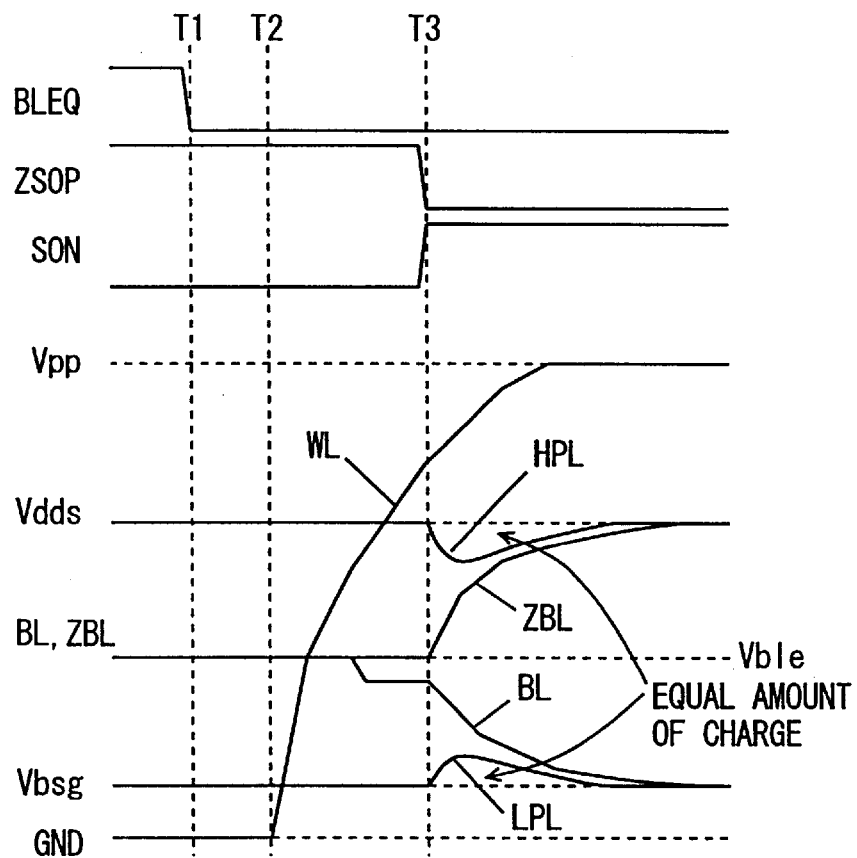
FIG. 3 is a signal waveform diagram representing an operation of the circuit of FIG. 2.

Similar to the conventional structure shown in FIG. 35, bit line equalize/precharge circuit E/P includes N channel MOS transistors TQ7 and TQ8 for precharging, and an N channel MOS transistor TQ9 for equalization. Memory cell MC includes a memory cell capacitor Cs, and an access transistor MT coupling bit line BL to capacitor Cs in response to the voltage of word line WL. Each of bit lines BL and ZBL is associated with a parasitic capacitance (bit line capacitance) Cb. Description is made that sense amplifier activation transistors TQ6 and TQ3 are provided in sense amplifier circuit S/A. In general, one pair of transistors TQ3 and TQ6 is provided for a plurality of sense amplifiers SA in a memory block (block on a sub word line basis). The operation of the sense amplifier circuit of FIG. 2 will now be described with reference to the signal waveform diagram of FIG. 3.

Consider the state where L level data is stored in memory cell MC. Before time T1, the semiconductor memory device is in a standby state, and bit line equalize designation signal BLEQ is at an H level. Therefore, bit lines BL and ZBL are both precharged and equalized to the level of intermediate voltage Vble. Here, intermediate voltage Vble is equal to (Vdds+Vbsg)/2, set at an intermediate value between the H level data and L level data stored in memory cell MC. The BSG scheme in which the substrate bias voltage Vbb is set to ground voltage GND is supposed.

In response to an externally applied row access command designating row access (row selection), bit line equalize designation signal BLEQ attains an inactive state of an L level, and bit line equalize/precharge circuit E/P is rendered inactive. The precharge operation on bit lines BL and ZBL is ceased. Bit lines BL and ZBL attain a floating state at the level of intermediate voltage Vble.

Then, a row select operation is effected according to the currently-applied address signal with the row access command. By this row select operation, the voltage level of word line WL corresponding to the addressed row rises at time T2. In response to the rise of the voltage level of word line WL, access transistor MT in memory cell MC conducts. Voltage difference is generated at bit lines BL and ZBL according to the logic level of the data stored in memory cell capacitor Cs. At the present case, L level data is stored in memory cell MC, and the voltage level of bit line BL becomes lower.

At time T3, sense amplifier activation signals ZSOP and SON are driven to the active state of an L level and an H level, respectively, according to sense amplifier activation signal SE. Sense amplifier SA is coupled to low level sense power supply line LPL and high level sense power supply line HPL via sense amplifier activation transistors TQ3 and TQ6, respectively, to start a sensing operation. The voltage levels on high level sense power supply line HPL and low level sense power supply line LPL are equal to the voltage levels of the H level data and L level data written (or restored) into memory cell MC, and are set to the levels of sense power supply voltage Vdds and boosted sense ground voltage Vbsg, respectively, at the initial state (prior to sensing operation).

The voltage levels on sense power supply lines HPL and LPL are maintained by HPL level control circuit 6 and LPL level control circuit 7 shown in FIG. 1, respectively.

Upon activation of sense amplifier SA at time T3, charge flows from high level sense power supply line HPL towards bit line ZBL via PMOS transistor TQ5 of the P sense amplifier, whereas charge flows out from bit line BL to low level sense power supply line LPL via MOS transistor TQ1 of the N sense amplifier SA. By this flow in/flow out of the charge, the voltage levels of high level sense power supply line HPL and low level sense power supply line LPL temporarily become lower and higher, respectively. This voltage change of sense power supply lines HPL and LPL can be alleviated to some extent by the decouple capacitance (not shown) connected to these sense power supply lines HPL and LPL. Eventually, the voltage change of these sense power supply lines is compensated for by HPL level control circuit 6 and LPL level control circuit 7 shown in FIG. 1.

Now, the amount of charge supplied to high level sense power supply line HPL by HPL level control circuit 6 and discharged to low level sense power supply line LPL by LPL level control circuit 7 during the sensing operation is obtained.

It is assumed that the parasitic capacitance per bit line BL (including the parasitic capacitance of the sense amplifier circuit) is Cb, the capacitance value of memory cell capacitor is Cs, the number of memory cells connected to selected word line WL is X, the amount of charge supplied from high level sense power supply line HPL is Qh, and the amount of charge discharged from low level sense power supply line LPL is Ql. After completion of the sensing operation, the voltages on high level sense power supply line HPL and low level sense power supply line LPL are maintained at the level of sense power supply voltage Vdds and boosted sense ground voltage Vbsg. Therefore, the following equations are derived from the conservation of electric charge.

$$Qh = X \cdot Cb \cdot (Vdds - Vble) \qquad (2)$$

$$Ql = X \cdot Cb \cdot (Vble - Vbsg) \qquad (3)$$

Here, it is assumed that the BSG scheme is employed, there is almost no flow out of charge from the memory cell, and the charge retaining time is long enough, and the voltage level of the H level data hardly differs from the sense power supply voltage Vdds even immediately before selection of a word line. The voltage level of intermediate voltage Vble is an intermediate value (½) of the voltage of the H level data relative to the L level data. Therefore, the following equation is established by the above equations.

$$Qh = Ql = X \cdot Cb \cdot (Vdds - Vbsg)/2 \qquad (4)$$

It is appreciated that the amount of charge supplied to hold high level sense power supply line HPL at the level of sense power supply voltage Vdds is equal to that discharged to hold low level sense power supply line LPL at the level of boosted sense ground voltage Vbsg.

In a sensing operation of sense amplifier SA, the voltage levels of bit lines BL and ZBL are transient and not fully amplified during a certain period from activation of sense amplifier. Therefore, charge is consumed at sense amplifier circuit S/A besides the charge/discharge of bit line load Cb. As to this extra charge consumption, only through current directly flows from high level sense power supply line HPL to low level sense power supply line LPL, and the aforementioned charge amount Qh and Ql are represented by the following equation with the charge transfer amount caused by the through current being Qdf.

$$Qh = Ql = X \cdot Cb \cdot (Vdds - Vbsg)/2 + Qdf \qquad (5)$$

More specifically, charge amount Qdf corresponding to the through current is supplied to high level sense power supply line, and LPL level control circuit 7 discharges charge amount Qdf corresponding to the through current flowing from high level sense power supply line HPL to low level sense power supply line LPL. Therefore, the condition that "the amount of charge supplied by HPL level control circuit 6 to maintain the voltage level of high level sense power supply line HPL is equal to the amount of charge discharged by LPL level control circuit 7 to retain the voltage level of low level sense power supply line LPL" does not change.

An ideal method of controlling a voltage level of high level sense power supply line HPL and low level sense power supply line LPL will be considered as follows. The transient change of the voltage level of one of high level sense power supply line HPL and low level sense power supply line LPL is compensated for by some way. The voltage level of the other sense power supply line is compensated for by monitoring accurately the charge amount required to compensate for the voltage level of the one sense power supply line and generating again the amount of required charge based on the monitored result. The following method is conventionally known to control the voltage of the low level sense power supply line; (i) rendering a MOS transistor discharging the voltage level of the low level sense power supply line conductive for a predetermined period of time after a sensing operation is started; or (ii) adjusting the voltage level of the low level sense power supply line by referring to a reference voltage of a level identical to boosted sense ground voltage Vbsg. However, according to these conventional voltage control methods, control of the voltage level of the low level sense power supply line is carried out independent of the amount of charge supplied to high level sense power supply line HPL. The conventional methods do not monitor the charge compensation amount of the high level sense power supply line, as in the present invention. The method according to the present invention completely differs from the conventional control methods of a low level sense power supply line. The control method of the present invention will be described more specifically in the below.

Figure 4:
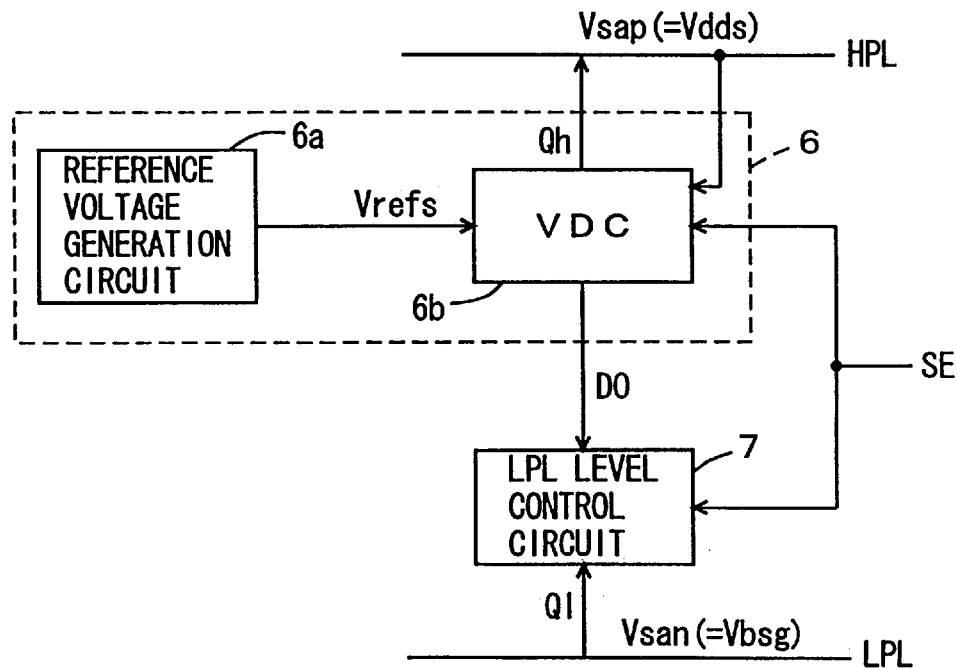
FIG. 4 schematically shows a structure of a sense power supply control circuit according to the first embodiment of the present invention.

FIG. 4 shows a schematic structure of HPL level control circuit 6 and LPL level control circuit 7 of FIG. 1. Referring to FIG. 4, HPL level control circuit 6 includes a reference voltage generation circuit 6a generating a reference voltage Vrefs, and an internal voltage-down converter (VDC) 6b comparing reference voltage Vrefs with a voltage Vsap of high level sense power supply line HPL to supply charge to high level sense power supply line HPL according to the comparison result. Internal voltage-down converter (VDC) 6b, whose structure will be described in detail afterwards, includes a comparator comparing reference voltage Vrefs with voltage Vsap on high level sense power supply line HPL, and a current drive transistor supplying current from an external power supply node, for example, to high level sense power supply line HPL according to a signal outputted from the comparator.

LPL level control circuit 7 monitors the amount of charge supplied to high level sense power supply line HPL by internal voltage-down converter 6b according to a signal DO indicating the comparison result of the comparator in internal voltage-down converter 6b, and discharges an amount of charge Ql according to the monitored result to low level sense power supply line LPL. Internal voltage-down converter 6b and LPL level control circuit 7 are rendered active in response to activation of sensing operation activation signal SE.

Internal voltage-down converter 6b and LPL level control circuit 7 operate during the active period of sense amplifier circuit S/A. Therefore, in addition to charge compensation during sensing operation, even if a bit line pair of a selected column (sense amplifier circuit) is coupled to an internal data line pair to cause change in the voltage levels of sense power voltages Vsap and Vsan in a data write/read operation, the voltage level can be restored speedily to the original level immediately by internal voltage-down converter 6b and LPL level control circuit 7.

Figure 5:
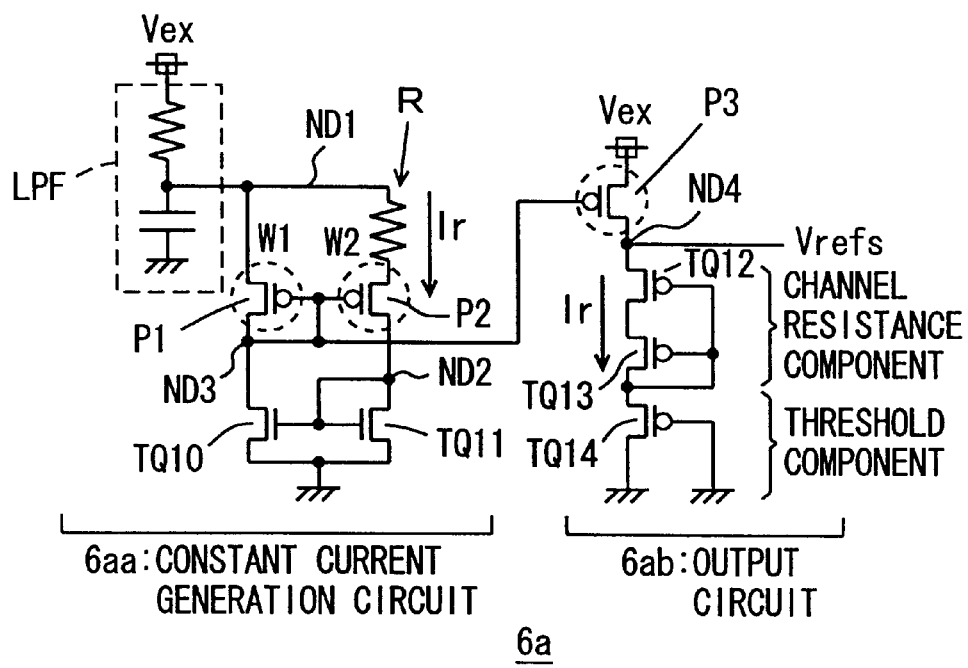
FIG. 5 shows an example of a structure of a reference voltage generation circuit of FIG. 4.

FIG. 5 shows an example of a structure of reference voltage generation circuit 6a of FIG. 4. Referring to FIG. 5, reference voltage generation circuit 6a includes a constant current generation circuit 6aa coupled to an external power supply node to generate a constant current Ir, and an output circuit 6ab converting constant current Ir from constant current generation circuit 6aa into a voltage to generate reference voltage Vrefs. Constant current generation circuit 6aa includes a low pass filter circuit LPF removing the high frequency noise component of external power supply voltage Vex to generate a power supply voltage to a node ND1, a resistance element R and a P channel MOS transistor P2 connected in series between nodes ND1 and ND2, and a P channel MOS transistor P1 connected between nodes ND1 and ND3. MOS transistor P1 has its gate and drain diode-connected. MOS transistor P2 has its gate connected to node ND3. The current drivability (channel width) of MOS transistors P1 and P2 are set to a ratio of, for example, 1:10.

Constant current generation circuit 6aa further includes an N channel MOS transistor TQ10 coupled between node ND3 and the ground node, and having a gate connected to node ND2, and an N channel MOS transistor TQ11 connected between node ND2 and the ground node, and having a gate connected to node ND2. MOS transistors TQ10 and TQ11 form a current mirror circuit to conduct a current of the same magnitude from nodes ND2 and ND3 to the ground node.

The channel width W1 of MOS transistor P1 and the channel width W2 of MOS transistor P2 (channel length thereof is identical) is set to W1<W2. MOS transistors P1 and P2 are used in the subthreshold region. More specifically, the channel resistance of MOS transistors TQ10 and TQ11 forming a current mirror circuit is set large enough, and only a small current is conducted from node ND1 to the ground node. In this case, since a current of the same magnitude flows to MOS transistors P1 and P2 having different current drivabilities, the source voltages of these MOS transistors P1 and P2 differ. As a result, a voltage difference dV represented by the following equation is generated across resistance element R.

$$dV = k \cdot T/q \cdot \ln(W2/W1) \quad (6),$$

where k represents the Boltzmann's constant, T is the absolute temperature, and q is the amount of charge of electrons. By generation of voltage dV across resistance element R, a current Ir represented by the following equation is generated.

$$Ir = dV/R,$$

where R is the resistance value of resistance element R. If the temperature dependency of resistance value R of the resistance element can be neglected, current Ir from constant current generation circuit 6aa has the positive temperature dependency.

Output circuit 6ab includes a P channel MOS transistor P3 connected between the external power supply node and node ND4, and having a gate connected to node ND3, and P channel MOS transistors TQ12–TQ14 connected in series between node ND4 and the ground node. MOS transistors TQ12 and TQ13 function as resistance elements to cause voltage drop by the channel resistance thereof. MOS transistor TQ14 has its gate connected to the ground node. The channel resistance of MOS transistor TQ14 is sufficiently small, and a voltage drop of the threshold voltage component is caused. MOS transistor P3 has a size (ratio of channel width to channel length) identical to that of MOS transistor P1. MOS transistors P1 and P3 form a current mirror circuit. A current of the same magnitude flows through MOS transistors P1 and P3. The channel resistance components of MOS transistors TQ12 and TQ13 succeed the positive temperature dependency of constant current Ir.

MOS transistor TQ14 has a size (ratio of channel width to channel length) large enough and the channel resistance component thereof can be neglected as compared to those of MOS transistors TQ12 and TQ13. A voltage drop of an absolute value Vthp of the threshold voltage of the transistor TQ14 occurs. Absolute value Vthp of the threshold voltage of P channel MOS transistor TQ14 has a negative temperature characteristic. Therefore, the positive temperature dependency of the channel resistance components of MOS transistors TQ12 and TQ13 is set to balance the negative temperature dependency of the threshold voltage components of MOS transistor TQ14. Accordingly, the temperature dependency of reference voltage Vrefs at node ND4 can be eliminated. Thus, the voltage level of reference voltage Vrefs can be held constant irrespective of the operation temperature.

Figure 6:
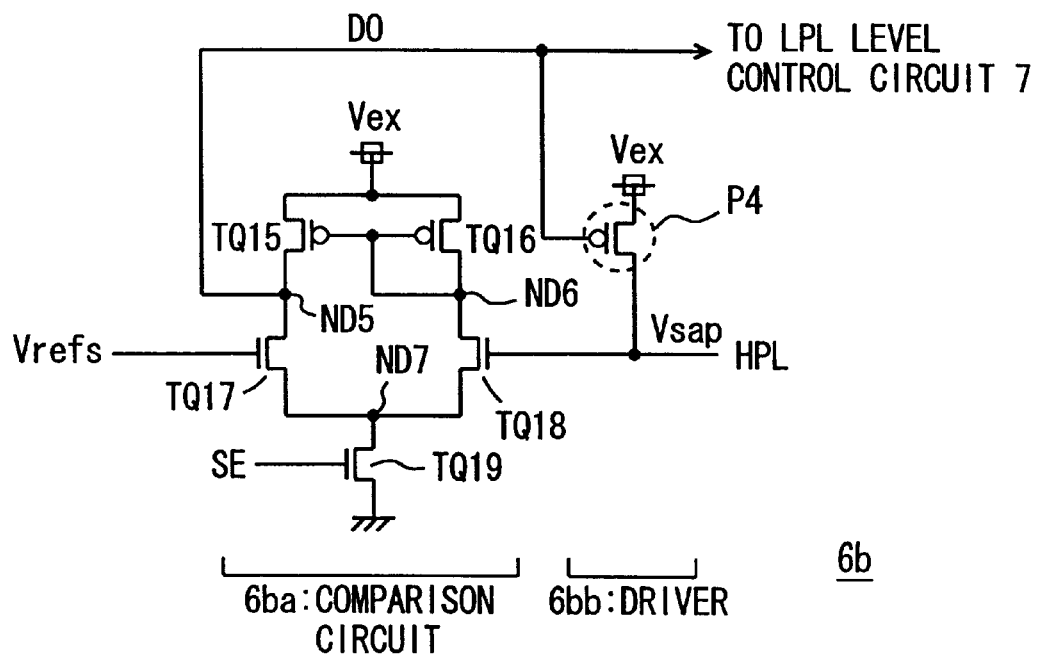
FIG. 6 shows a structure of an internal voltage-down converter of FIG. 4.

FIG. 6 shows an example of a structure of an internal voltage-down converter (VDC) of FIG. 4. Referring to FIG. 6, internal voltage-down converter 6b includes a comparator 6ba comparing the voltage Vsap of high level sense power supply line HPL with reference voltage Vrefs, and a P channel MOS transistor (current drive transistor) P4 supplying charge from the external power supply node to high level sense power supply line HPL according to signal DO output from comparator 6ba. Comparator 6ba includes P channel MOS transistors TQ15 and TQ16 coupled to an external power supply node and forming a current mirror circuit, an N channel MOS transistor TQ17 connected between nodes ND5 and ND7 and receiving reference voltage Vrefs at a gate thereof, an N channel MOS transistor TQ18, connected between nodes ND6 and ND7, receiving sense power supply voltage Vsap on high level sense power supply line HPL at a gate thereof, and an N channel MOS transistor TQ19, connected between node ND7 and the ground node, receiving sensing operation activation signal SE at a gate thereof. The operation of internal voltage-down converter of FIG. 6 will be described briefly now.

When sensing operation activation signal SE is at an L level, N channel MOS transistor TQ19 is off to cut off the path of the current flow in comparator 6ba. Therefor, nodes ND5 and ND6 are held at the level of external power supply voltage Vex. Under this state, MOS transistor P4 is also off. Charge is not supplied to high level sense power supply line HPL.

When sensing operation activation signal SE attains an active state of an H level, MOS transistor TQ19 is turned on. Responsively, comparator 6ba is rendered active to compare reference voltage Vrefs with voltage Vsap on high level sense power supply line HPL. When high level sense power supply voltage Vsap is higher than reference voltage Vrefs, the conductance of MOS transistor TQ18 becomes larger than the conductance of MOS transistor TQ17. The current flowing through MOS transistors TQ16 and TQ18 become greater than the current flowing through MOS transistor TQ17.

MOS transistors TQ15 and TQ16 form a current mirror circuit with MOS transistor TQ16 being the master stage of the current mirror circuit. A current of a magnitude identical to the current flowing through MOS transistor TQ16 is conducted to MOS transistor TQ15. In response, the voltage level of node ND5, i.e., the voltage level of signal DO, increases.

When voltage Vsap is lower than reference voltage Vrefs, the current flowing through MOS transistor TQ17 becomes greater than the current flowing through MOS transistor TQ18. In this case, MOS transistor TQ16 only supplies current flowing through MOS transistor TQ18, so that the voltage level of node ND5 is reduced. In response, the conductance of MOS transistor P4 becomes larger, and charge is supplied from the external power supply node to high level sense power supply line HPL to increase the level of voltage Vsap.

A signal DO indicating the comparison result is generated as an analog signal from comparator 6ba, according to the difference between voltage Vsap on high level sense power supply line HPL and reference voltage Vrefs. Output signal DO from comparator 6ba is applied to LPL level control circuit 7, and LPL level control circuit 7 discharges charge of an amount substantially equal to the amount of charge supplied by MOS transistor P4 from low level sense power supply line LPL towards the ground node according to signal DO indicating the comparison result.

Figure 7:
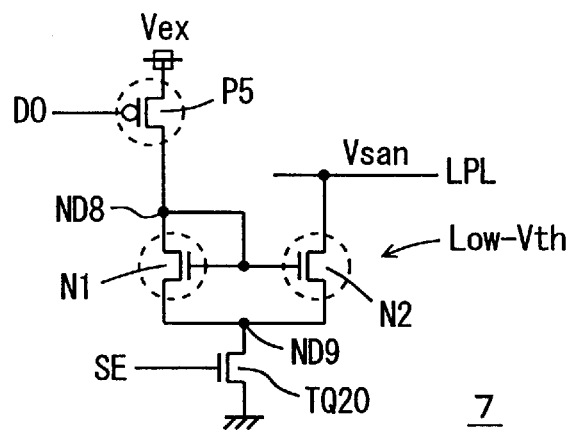
FIG. 7 shows a structure of an LPL level control circuit of FIG. 4.

FIG. 7 shows an example of a structure of LPL level control circuit 7 of FIG. 4. Referring to FIG. 7, LPL level control circuit 7 includes a P channel MOS transistor P5 supplying current to node ND8 from the external power supply node according to signal DO outputted from comparator 6ba shown in FIG. 6, an N channel MOS transistor N1 connected between nodes ND8 and ND9, and having a gate connected to node ND8, an N channel MOS transistor N2 connected between low level sense power supply line LPL and node ND9, and having a gate connected to node ND8, and an N channel MOS transistor TQ20 connected between node ND9 and the ground node and receiving sensing operation activation signal SE at a gate thereof. MOS transistors N1 and N2 form a current mirror circuit.

MOS transistor P5 supplies charge from the external power supply node to node ND8 according to signal DO outputted from comparator 6ba of FIG. 6. The amount of charge supplied by MOS transistor P5 to node ND8 corresponds to the amount of charge supplied by MOS transistor P4 of the internal voltage-down converter of FIG. 6. More specifically, MOS transistor P5 monitors the amount of charge supplied by MOS transistor P4 according to output signal DO of comparator 6ba (refer to FIG. 6), and supplies charge from the external power supply node to node ND8 according to the monitored result. The current flowing via MOS transistor P5 is set to a constant multiple of the current flowing through MOS transistor P4. MOS transistors N1 and N2 form a current mirror circuit. Therefore, a current corresponding to the current supplied by MOS transistor P5 is discharged from low level sense power supply line LPL towards the ground node. If the mirror ratio of the current mirror circuit formed of MOS transistors N1 and N2 is a reciprocal of the ratio of the current supply abilities of MOS transistors P4 and P5, the amount of charge discharged from low level sense power supply line LPL to the ground node can be set accurately equal to the amount of charge supplied to high level power supply line HPL. More specifically, MOS transistors P4, P5, N1 and N2 must satisfy the relationship of the following equation.

$$P5(W/L)/P4(W/L)=N1(W/L)/N2(W/L) \qquad (7)$$

P5(W/L), P4(W/L), N1(W/L) and N2(W/L) indicate the ratio of the channel width W to the channel length L of MOS transistors P5, P4, N1 and N2, respectively. To suppress the through current flowing from the external power supply node of LPL level control circuit 7 to the ground node during the sense period of sense amplifier circuit S/A, the sizes (ratio of channel width to channel length) of MOS transistors P5 and N1 can be reduced to the one that does not affect the response speed or the like of LPL level control circuit 7. Even if sense amplifier activation signal SE attains an H level, MOS transistor P4 is turned off at the time point when voltage Vsap on high level sense power supply line HPL is restored to a level equal to reference voltage Vrefs, and the current flowing through MOS transistor P4 becomes 0. At the same time, MOS transistor P5 of LPL level control circuit 7 is turned off, so that the through current becomes 0 as well.

MOS transistors N1 and N2 must operate in a saturation region in order to operate as a current mirror circuit during the operation period. Therefore, it is desirable that the threshold voltages of MOS transistors N1 and N2 are set lower than the threshold voltage of an N channel MOS transistor used in the peripheral circuitry. More specifically, an MOS transistor of a low threshold voltage (Low_Vth) is used as MOS transistors N1 and N2. Here, the saturation region is a region represented by the following equation.

$$|Vds| \geq |Vgs-Vth|$$

where Vds is the drain-source voltage of the MOS transistor, Vgs the gate-source voltage of the MOS transistor, and Vth the threshold voltage of the MOS transistor.

Even in the case where voltage Vsan on low level sense power supply line LPL is lowered, MOS transistor N2 is operated in the saturation region to discharge mirror current from low level power supply line LPL to the ground node.

Sensing operation activation signal SE may be rendered active at the time of starting a sensing operation of amplifying the voltage difference of the bit lines after the word line attains a selected gate and sense amplifier activation signals SON and ZSOP may be generated according to the sensing operation activation signal and, for example, a row block select signal (when the memory array has a block-division (partial activation) structure).

LPL control circuit 7 and HPL control circuit 6 are rendered active at the same timing. However, HPL control circuit 6 may be rendered active at the time of starting a row select operation carried out in response to, for example, an applied row access command, and LPL control circuit 7 may be rendered active at the time of starting a sensing operation. In other words, HPL control circuit 6 may be rendered active according to activation of an internal row address strobe signal RAS in a standard DRAM, and LPL control circuit 7 may be rendered active at an elapse of a predetermined time from activation of internal row address strobe signal RAS.

According to the first embodiment of the present invention, the current required to control the voltage of high level sense power supply line HPL is monitored to generate a discharging current of the low level sense power supply line according to the monitored result in a memory array power supply structure where the voltage of the sense ground line is set higher than the level of ground voltage GND. Therefore, the voltage level change in the sense ground line caused by a sensing operation can be compensated for accurately. Even in the case where the low level sense power supply line is set at a level higher than the level of the ground voltage in accordance with for example, the BSG scheme, the voltage level of the low level sense power supply line can be set properly at a predetermined level of boosted ground voltage. The circuit configuration of the control circuit is simple. There is also the advantage that the through current from the external power supply node of the LPL control circuit towards the ground node is suppressed to reduce current consumption when the data on bit lines BL and ZBL are completely amplified and the voltage level attain the levels of H level data and L level data, i.e. when the voltage of high level sense power supply line HPL returns to the original voltage level.

Second Embodiment

Figure 8:
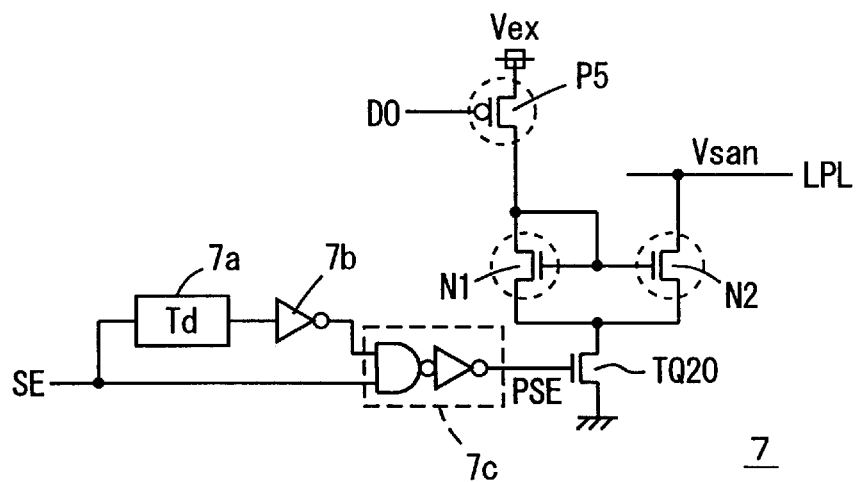
FIG. 8 shows a structure of an LPL level control circuit according to a second embodiment of the present invention.

FIG. 8 shows a structure of an LPL control circuit according to a second embodiment of the present invention. Referring to FIG. 8, a pulse-form control signal PSE is applied to the gate of MOS transistor TQ20 for activation of LPL control circuit 7. The circuit generating the pulse-form control signal PSE includes a delay circuit 7a delaying sensing operation activation signal SE by a predetermined time Td, an inverter 7b inverting the output signal of delay circuit 7a, and an AND circuit 7c receiving an output signal of inverter 7b and sensing operation activation signal SE. Pulse-form control signal PSE is outputted from AND circuit 7c. The HPL control circuit is similar in configuration to that of the first embodiment. The operation of the circuit of FIG. 8 will be described with reference to the signal waveform diagram of FIG. 9.

Figure 9:
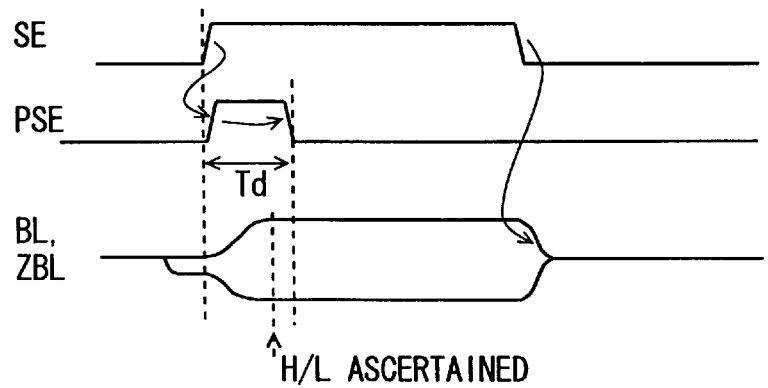
FIG. 9 is a signal waveform diagram representing an operation of the circuit of FIG. 8.

When MOS transistor TQ20 conducts in response to activation (H level) of pulse-form control signal PSE, LPL control circuit 7 monitors the amount of charge supplied by the internal voltage-down converter to high level sense power supply line HPL with a signal DO to discharge an identical amount of charge from low level sense power supply line LPL to the ground node according to the monitoring result. Pulse-form control signal PSE is pulled up simultaneous to the rise of sensing operation activation signal SE to an H level, and is pulled down to an L level at an elapse of a delay time Td of delay circuit 7a. Delay time Td of delay circuit 7a corresponds to the period of time required for the voltage levels of bit lines BL and ZBL to attain the voltage levels of H level data and L level data after the sensing operation of the sense amplifier circuit is completed. FIG. 9 represents an example of signal waveform when L level data is read out to one of bit lines BL and ZBL.

When there is a leak path in the HPL level control circuit or high level sense power supply line through which leakage current flows to the ground node, the HPL level control circuit continues to supply current so that the voltage Vsap on high level sense power supply line HPL can be equal to reference voltage Vrefs even after the sensing operation is completed. LPL level control circuit 7 draws, from low level sense power supply line LPL, charge of an amount equal to that supplied by HPL level control circuit to high level sense power supply line HPL. This means that LPL level control circuit 7 draws, from low level sense power supply line LPL, a current similar in amount to the leakage current flowing through the leak path. The voltage Vsan on low level sense power supply line LPL is eventually reduced to the level of ground voltage GND. By generating pulse-form control signal PSE according to sensing operation activation signal SE to render the LPL level control circuit active only during a predetermined period of time in a sensing operation, charge more than needed will not be drawn out from low level sense power supply line LPL. The voltage Vsan on low level sense power supply line LPL can be maintained stably at the predetermined level of boosted sense ground voltage Vbsg.

According to the second embodiment of the present invention, the LPL level control circuit is operated only for a predetermined time from starting of the sensing operation to prevent variation in the voltage level of the high level sense power supply line caused by a leak path, for example, after completion of the sensing operation of data on bit lines BL and ZBL from being transmitted to low level sense power supply line LPL. Thus, the voltage of the low level sense power supply line can be maintained stably at a predetermined voltage level.

Third Embodiment

Figure 10:
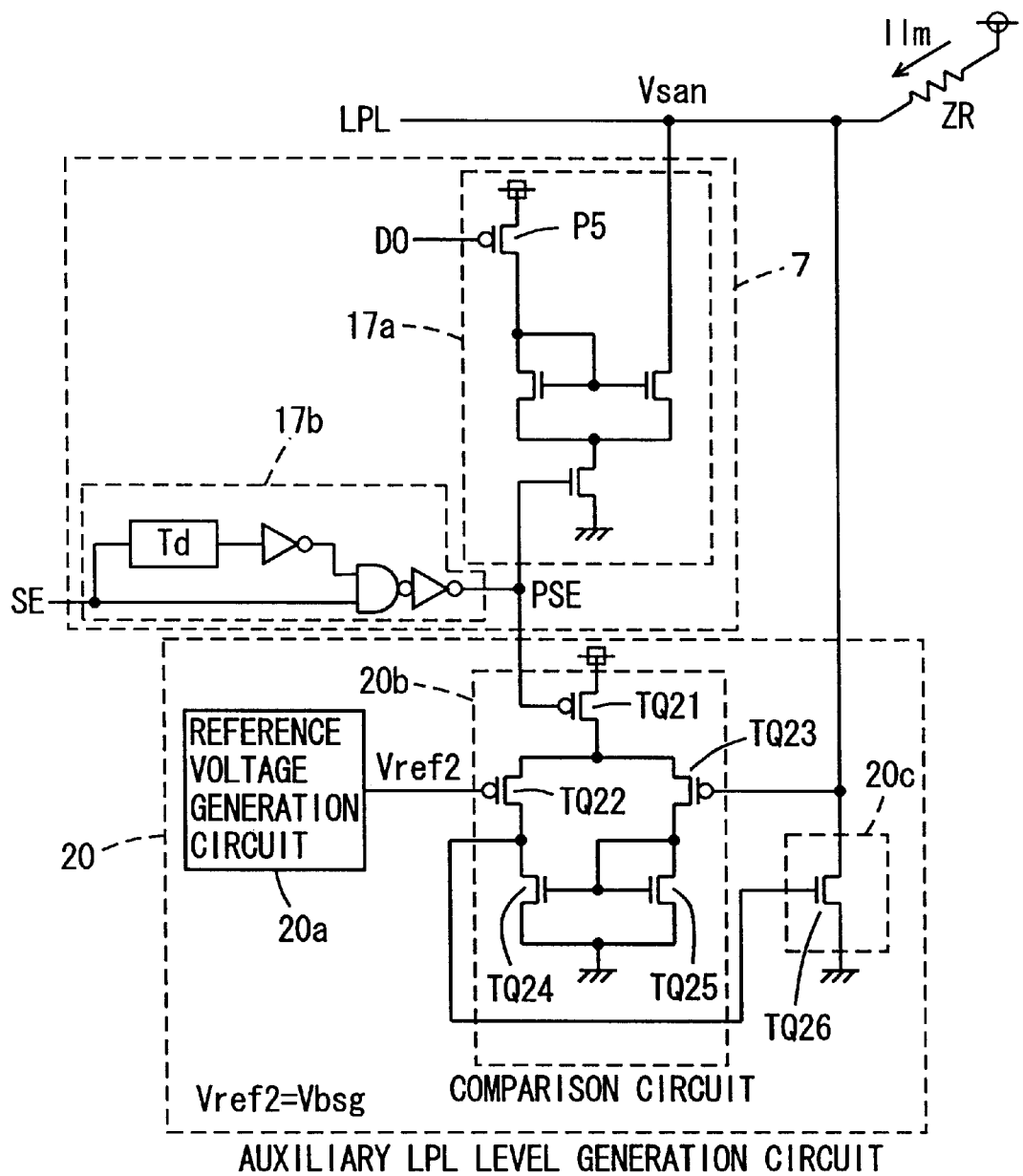
FIG. 10 shows a structure of an LPL level control circuit according to a third embodiment of the present invention.

FIG. 10 shows a structure of a main part of a semiconductor memory device according to a third embodiment of the present invention. In the structure of FIG. 10, a LPL level control circuit 7 to suppress variation of voltage Vsan of low level sense power supply line LPL in a sensing operation, and an auxiliary LPL level generation circuit 20 rendered inactive and active in a sensing operation and not in a sensing operation, respectively, to set voltage Vsan of low level sense power supply line LPL to a voltage level according to reference voltage Vref2 are provided to adjust the voltage of the low level sense power supply line. LPL level control circuit 7 and auxiliary LPL level generation circuit 20 are rendered active in a complementary manner to each other.

LPL level control circuit 7 includes an LPL level generation circuit 17a drawing out charge from low level sense power supply line LPL according to an output signal DO from a comparator of a sense power supply circuit not shown when active, and an active control circuit 17b generating a pulse control signal PSE rendered active for a predetermined time (a constant time including at least the sense period) in response to activation of sensing operation activation signal SE to render LPL level generation circuit 17a active. LPL level generation circuit 17a has a structure identical to that shown in FIGS. 7 and 8 and includes MOS transistors P5, N1, N2 and TQ20 as shown in FIGS. 7 and 8. Active control circuit 17b has a structure identical to that shown in FIG. 8 and includes delay circuit 7a, inverter 7b and AND circuit 7c. Therefore, LPL level control circuit 7 discharges charge of an amount substantially equal to the amount of the charge supplied by the sense power supply circuit to high level sense power supply line HPL towards the ground node from low level sense power supply line LPL.

Auxiliary level generation circuit 20 includes a reference voltage generation circuit 20a generating reference voltage Vref2, a comparator 20b comparing reference voltage Vref2 generated by reference voltage generation circuit 20a with the voltage Vsan on low level sense power supply line LPL, and a current driver 20c discharging current from low level sense power supply line LPL to the ground node according to the output signal from comparator 20b. Reference voltage generation circuit 20a generates reference voltage Vref2 of a voltage level equal to boosted sense ground voltage Vbsg. Reference voltage generation circuit 20a is realized, for example, using a structure shown in FIG. 5.

Comparator 20b includes a P channel MOS transistor TQ21 for activation, P channel MOS transistors TQ22 and TQ23 forming a comparison stage for comparing reference voltage Vref2 with voltage Vsan on low level sense power supply line LPL, and N channel MOS transistors TQ24 and TQ25 forming a current mirror circuit discharging a current of the same magnitude from MOS transistors TQ22 and TQ23 to the ground node. MOS transistor TQ25 is the master stage of the current mirror circuit. An output signal of comparator 20b is generated at the connection node connecting MOS transistors TQ22 and TQ24. Current driver 20c includes an N channel MOS transistor TQ26 having a conductance changed according to the output signal from comparator 20b to discharge current from low level sense power supply line LPL to the ground node.

LPL level control circuit 7 discharges charge from low level sense power supply line LPL to maintain the voltage Vsan on low level sense power supply line LPL at the level of boosted sense ground voltage Vbsg in a sensing operation. In LPL level control circuit 7, the activation transistor of LPL level generation circuit 17a is an N channel MOS transistor, whereas activation transistor TQ21 of the comparator of auxiliary LPL level generation circuit 20 is a P channel MOS transistor. Therefore, auxiliary LPL level generation circuit 20 maintains an inactive state during the activation period of LPL level control circuit 7.

Consider the case where a small leakage current Ilm flows to low level sense power supply line LPL caused by micro-short ZR to, for example, a power supply node, in low level sense power supply line LPL. Since such micro-short ZR has a sufficient large resistance to provide hardly no affect in a normal operation, the sensing operation is not affected. Therefore, the voltage Vsan of low level sense power supply line LPL can be set to the level of boosted sense ground voltage Vbsg by LPL level control circuit 7 during the sense period. However, when the sensing operation period is completed and LPL level control circuit 7 is rendered inactive, small leakage current Ilm flows to low level sense power supply line LPL via micro-short ZR. As a result, the level of voltage Vsan is deviated from the level of boosted sense ground voltage Vbsg.

Auxiliary LPL level generation circuit 20 is rendered active when LPL level control circuit 7 is inactive. In auxiliary LPL level generation circuit 20, the output signal of comparator 20b attains a high level (analog signal) when the voltage Vsan of low level sense power supply line LPL becomes higher than reference voltage Vref2 (=Vbsg) in an activation period, whereby the conductance of N channel MOS transistor TQ26 in current driver 20c is increased. Charge is discharged from low level sense power supply line LPL, and the voltage Vsan on low level sense power supply line LPL is set to the level of reference voltage Vref2 (=Vbsg).

What is required for auxiliary LPL level generation circuit 20 is the current drivability of a level that compensates for voltage change in the low level sense power supply line caused by a leak path such as micro-short. Therefore, both the circuit complexity and the through current can be reduced.

Usage of auxiliary LPL level generation circuit 20 shown in FIG. 10 also provides the following advantages. In the structure shown in the first embodiment, the current drive transistor (P channel MOS transistor P4) in the sense power supply circuit and the transistor for monitoring the current (P channel MOS transistor P5) in LPL level control circuit 7 must be operated in a saturation region in order to operate in an ideal manner. This is because the drain current is determined depending upon the gate-source voltage and the threshold voltage of the MOS transistor when operating in a saturation region. In a non-saturation region, the current cannot be monitored correctly due to the affect of drain-source voltage.

There may be a case where current drive transistor P4 of the internal voltage-down converter does not operate in the saturation region because of the structure of the internal voltage-down converter (VDC) shown in FIG. 6 (there may be a case where |Vds|≧|Vgs−Vthp| is not established; as is the case where the difference between the voltage levels of external power supply voltage Vex and sense power supply voltage Vdds is small). In this case, the charge flowing to low level sense power supply line LPL cannot be monitored always accurately. LPL level control circuit 7 draws out charge corresponding to the inaccurate result of monitoring the amount of charge supplied to high level sense power supply line HPL by the sense power supply circuit from low level sense power supply line LPL. This deviation from the required amount is compensated for by auxiliary LPL level generation circuit 20. Since LPL level control circuit 7 basically plays a dominantly role, the ability required for auxiliary LPL control circuit 20 is not so great.

Modification

Figure 11:
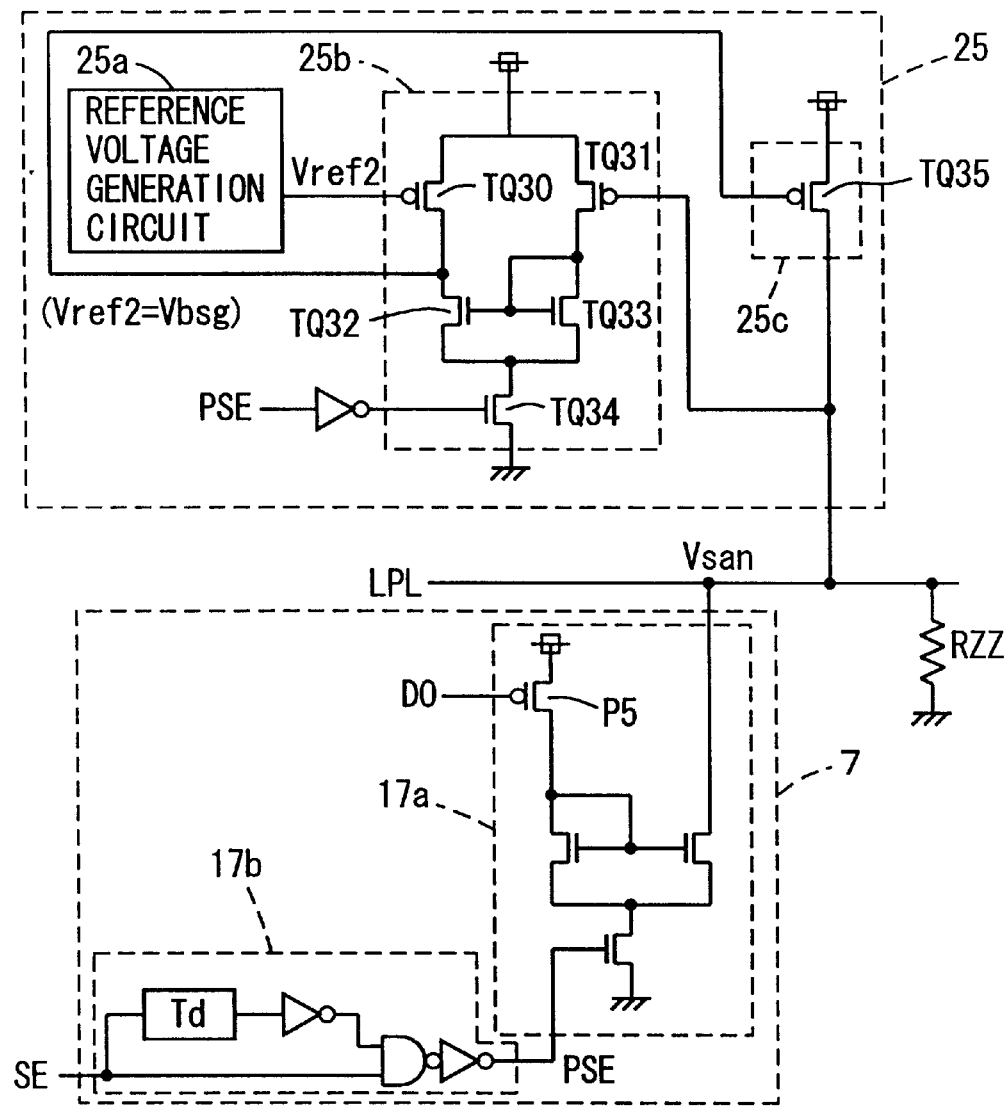
FIG. 11 shows a modification of the third embodiment of the present invention.

FIG. 11 shows a modification of the third embodiment of the present invention. In the structure of FIG. 11, an auxiliary LPL generation circuit 25 is provided to supply charge when the voltage Vsan of low level sense power supply line LPL becomes lower than the level of boosted sense ground voltage Vbsg, to suppress level reduction of the voltage Vsan of low level sense power supply line LPL. Auxiliary LPL level generation circuit 25 includes a reference voltage generation circuit 25a generating reference voltage Vref2 (=Vbsg), a comparator 25b comparing reference voltage Vref2 with the voltage Vsan on low level sense power supply line LPL, and a current driver 25c supplying charge from the external power supply node to low level sense power supply line LPL according to an output signal from comparator 25b.

Comparator 25b includes P channel MOS transistors TQ30 and TQ31 comparing reference voltage Vref2 with voltage Vsan on low level sense power supply line LPL, N channel MOS transistors TQ32 and TQ33 forming a current mirror circuit drawing out current of the same magnitude from MOS transistors TQ30 and TQ31, and N channel MOS transistor TQ34 rendered conductive, according to an inverted signal of pulse-form control signal PSE, to couple the source nodes of MOS transistors TQ32 and TQ33 to the ground node. MOS transistor TQ33 is the master stage of the current mirror stage. An output signal of comparator 25b is outputted from the connection node of MOS transistors TQ30 and TQ32.

Current driver 25c includes a P channel MOS transistor TQ35 receiving an output signal of comparator 25b at a gate thereof. Low level sense power supply line LPL is provided with a LPL level control circuit 7, similar to that of the first embodiment. During a sensing operation, auxiliary LPL level generation circuit 25 maintains an inactive state. Therefore, charge of an amount equal to the charge amount supplied to high level sense power supply line HPL by the HPL level control circuit is drawn out from low level sense power supply line LPL by LPL level control circuit 7 during the sense period.

When the sensing operation is completed and pulse-form control signal PSE attains an L level, LPL level control circuit 7 is rendered inactive. In contrast, auxiliary LPL generation circuit 25 is rendered active. More specifically, MOS transistor TQ34 of comparator 25b is turned on, and an operating current flows to comparator 25b. When reference voltage Vref2 is higher than voltage Vsan on low level sense power supply line LPL, the conductance of MOS transistor TQ31 of comparator 25b becomes greater than the conductance of MOS transistor TQ30, whereby a large current flows from MOS transistor TQ31 to MOS transistor TQ33. MOS transistor TQ32 draws out current of a magnitude identical to that of the current flowing through MOS transistor TQ33. Therefore, the voltage level of the output signal from comparator 25b is lowered, and the conductance of MOS transistor TQ35 of current driver 25c increases. Current is supplied to low level sense power supply line LPL to increase the voltage level thereof.

When reference voltage Vref2 is lower than voltage Vsan of low level sense power supply line LPL, the conductance of MOS transistor TQ31 becomes larger than the conductance of MOS transistor TQ31. In this case, MOS transistor TQ32 cannot discharge all the current supplied from MOS transistor TQ30, so that the voltage level of the output signal of comparator 25b rises. Therefore, MOS transistor TQ 35 turns off and does not supply any charge to low level sense power supply line LPL.

In the case where there is micro-short RZZ coupled to the ground node at low level sense power supply line LPL, a small leakage current flows from low level sense power supply line LPL to the ground node. Contrary to the case of FIG. 10, even if LPL level control circuit 7 supplies the same amount of charge to low level sense power supply line LPL as that the HPL level control circuit does to high level sense power supply line HPL, leakage current via micro-short RZZ lowers the level of the voltage Vsan after the sense period Td. In this case, level reduction of voltage Vsan of low level sense power supply line LPL is suppressed by means of auxiliary LPL generation circuit 25.

Even in the case where LPL control circuit 7 cannot draw out charge corresponding to the amount of charge supplied of the sense power supply circuit to result in drawing out excessive charge from low level sense power supply line LPL, auxiliary LPL generation circuit 25 of FIG. 11 can compensate for the amount of charge excessively drawn out, so that voltage Vsan of low level sense power supply line LPL can be maintained at the predetermined level of boosted source ground voltage Vbsg. Auxiliary LPL generation circuit 25 is required of only a small current drivability, and the occupying area thereof is small.

Figure 12:
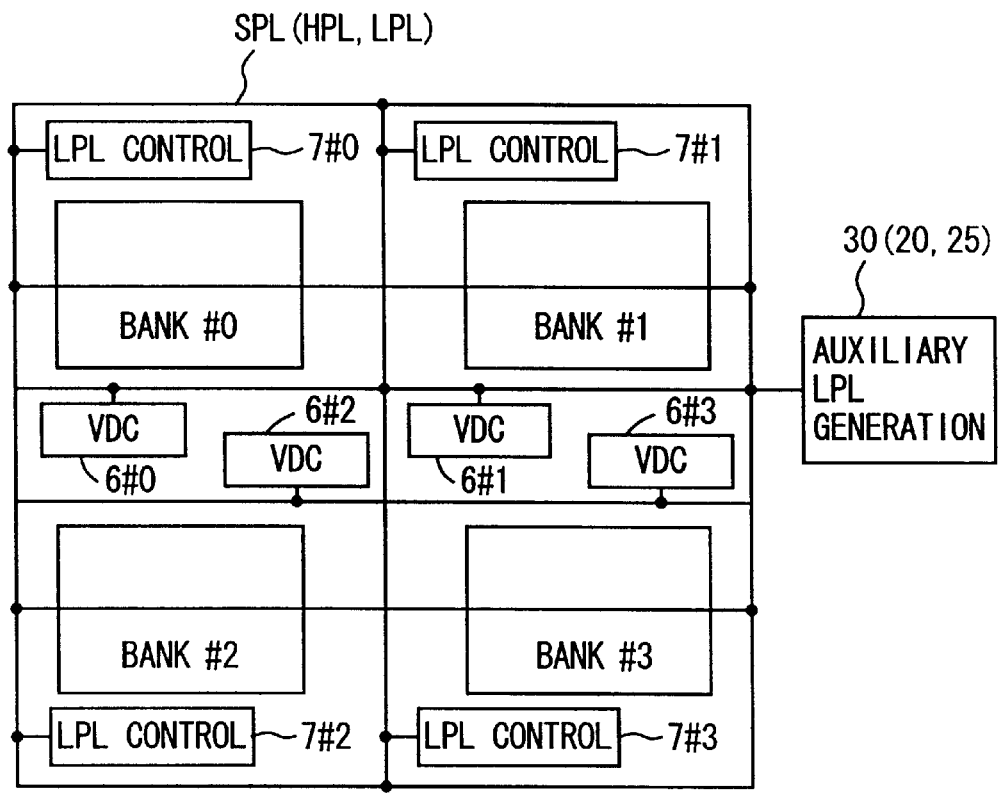
FIG. 12 schematically shows arrangement of a sense power supply voltage control circuit of the semiconductor memory device according to the third embodiment of the present invention.

FIG. 12 schematically shows an entire structure of a semiconductor memory device according to the third embodiment of the present invention. Referring to FIG. 12, the semiconductor memory device includes four banks #0–#3. A sense power source line SPL (HPL and LPL) is arranged common to banks #0–#3. Sense power source line SPL extends over each of banks #0–#3 to be arranged in a meshed shape. Internal voltage-down converters (VDC) (HPL level control circuit) 6#0–6#3 are arranged corresponding to banks #0–#3, respectively, with respect to sense power source line SPL. Similarly, LPL control circuits 7#0–7#3 are arranged corresponding to banks #0–#3, respectively. Therefore, the charge transfer amount of high level sense power supply line HPL and low level sense power supply line LPL are monitored to adjust the voltage level of low level sense power supply line LPL on a bank-by-bank basis.

An auxiliary LPL generation circuit 30 (20 and/or 25) is provided common to banks #0–#3. Auxiliary LPL generation circuit 30 (20 and/or 25) suppresses change in the voltage level of low level sense power supply line LPL in an active standby state after the sensing operation is completed or in an inactive state of the semiconductor memory device, and merely compensates for leakage current. Therefore, auxiliary LPL generation circuit 30 is provided common to banks #0–#3. In banks #0–#3, the row select operation (activation of sense amplifier) is executed independent of each other. Therefore, LPL control circuits 7#0–7#3 and HPL control circuit (internal voltage-down converter (VDC)) 6#0–6#3 are provided corresponding to banks #0–#3, respectively.

According to the third embodiment of the present invention, an auxiliary LPL generation circuit is provided to compensate for the voltage level of the low level sense power supply voltage during a period where a sensing operation is completed or not carried out, and low level sense power source voltage Vsan can be maintained at the level of boosted sense ground voltage Vbsg over the entire period in a standby period or in an active period of the semiconductor memory device regardless of whether there is a cause to change the voltage level of the low level sense power supply line such as a leak path.

The number of banks is not limited to 4 in the structure shown in FIG. 12. Also, auxiliary LPL generation circuit 30 can be arranged at the center of banks #0–#3.

Fourth Embodiment

Figure 13:
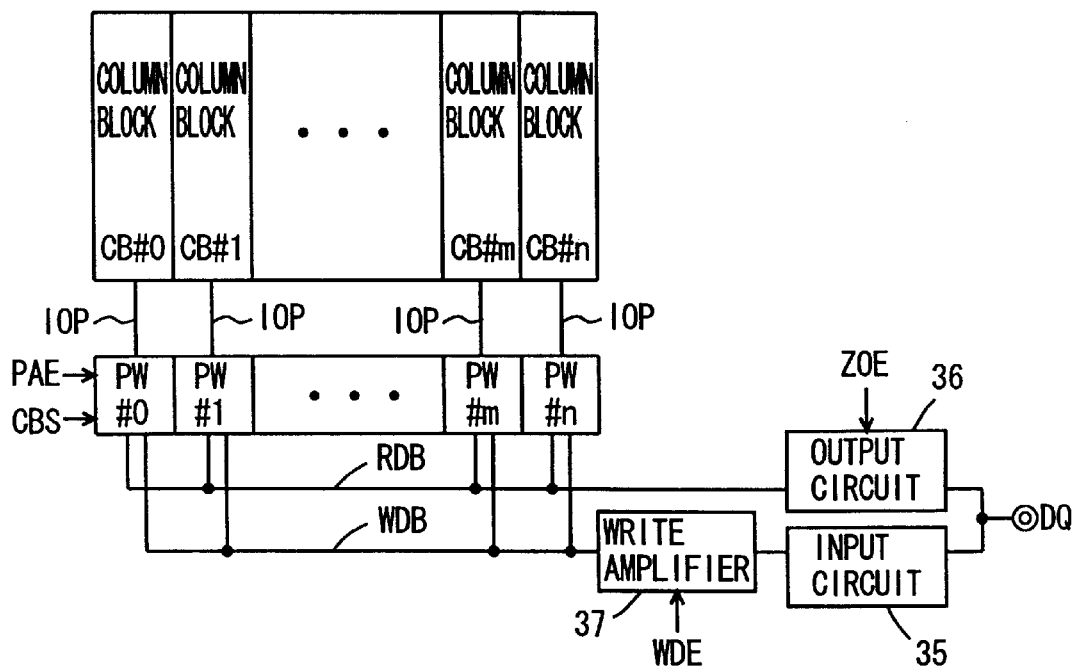
FIG. 13 schematically shows a structure of a main part of a semiconductor memory device according to a fourth embodiment of the present invention.

FIG. 13 schematically shows an entire structure of a semiconductor memory device according to a fourth embodiment of the present invention. The memory array is divided into a plurality of column blocks CB#0–CB#n. An internal data line pair IOP is arranged corresponding to each of column blocks CB#0–CB#n. Preamplifier/write driver circuits PW#0–PW#n are provided corresponding to column blocks CB#0–CB#n, respectively. Preamplifier/write drive circuits PW#0–PW#n are selected by a column block select signal CBS. When selected, the preamplifier circuit carries out a data amplifying operation on the corresponding internal data line pair according to preamplifier activation signal PAE. The write driver circuit drives a corresponding internal data line pair, when selected, according to internal write data from the write amplifier circuit 37.

The semiconductor memory device further includes an output circuit 36 outputting externally data read out onto an internal read data bus RDB by the preamplifier circuit of a selected preamplifier/write driver circuit when output enable signal ZOE is active, and an input circuit 35 buffering externally applied data, and a write amplifier circuit 37 rendered active according to write driver enable signal WDE according to internal write data from input circuit 35 to generate complementary internal write data for transmission to an internal write data bus WDB.

In a data write/read operation, a selected column in each of column blocks CB#0–CB#n is coupled to a corresponding internal data line pair IOP. Therefore, when the sense node (bit line pair) of the sense amplifier circuit is connected with internal data line pair IOP, charge flows from internal data line pair IOP to cause change in the sense power supply voltage through the sense amplifier circuit.

Although bus arrangement of separated read and write type is shown in which a read data bus and a write data bus are provided separately and individually, the operation of the preamplifier and write driver is identical even in a bus arrangement of the read/write common type in which read data and write data are transmitted through a common data bus. The change and compensation method of the sense power supply voltage in a write/read operation will be described now.

Figure 14:
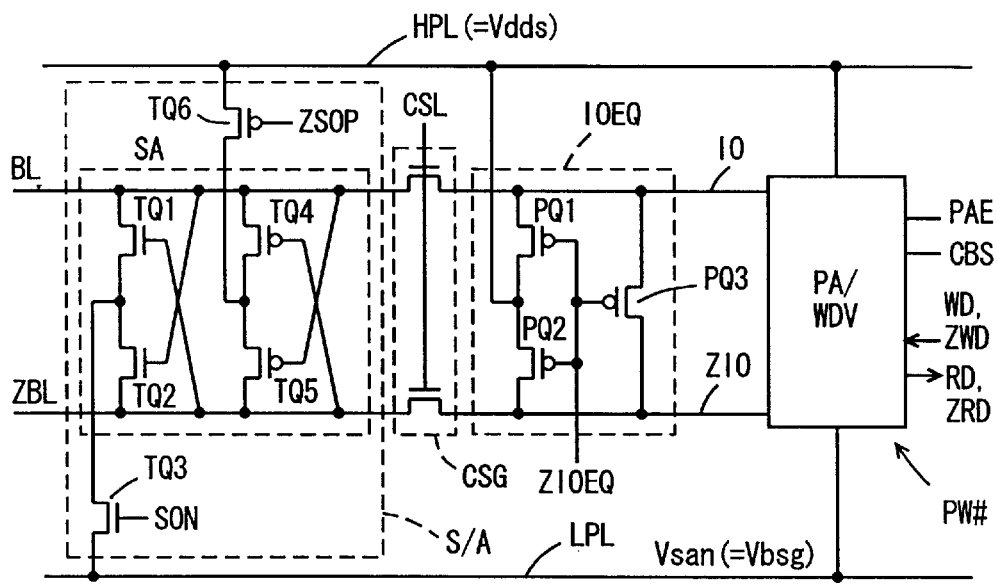
FIG. 14 schematically shows a structure of the portion related to data writing/reading of the semiconductor memory device of FIG. 13.

FIG. 14 shows a structure of the portion related to writing/reading data in the semiconductor memory device of FIG. 13. In FIG. 14, a sense amplifier circuit S/A is provided at bit lines BL and ZBL. Sense amplifier circuit S/A includes a sense amplifier SA to amplify the voltage difference of bit lines BL and ZBL, and sense amplifier activation MOS transistors TQ6 and TQ3 responsive to sense amplifier activation signals ZSOP and SON to couple high level sense power supply line HPL and low level sense power supply line LPL, respectively, to sense amplifier SA. Similar to the previous first to third embodiments, sense amplifier SA includes cross-coupled N channel MOS transistors TQ1 and TQ2, and cross-coupled P channel MOS transistors TQ4 and TQ5.

Bit lines BL and ZBL are coupled to internal data lines IO and ZIO via a column select gate CSG rendered conductive in response to a column select signal CSL. Internal data lines IO and ZIO are provided with a data line precharge/equalize circuit IOEQ precharging and equalizing internal data lines IO and ZIO to the level of sense power supply voltage Vdds when active. Data line precharge/equalize circuit IOEQ includes P channel MOS transistors PQ1 and PQ2 rendered conductive in response to activation of data line equalize designation signal ZIOEQ to transmit voltage Vdds on high level sense power supply line HPL to internal data lines IO and ZIO, and P channel MOS transistor PQ3 rendered conductive in response to activation of data line equalize designation signal ZIOEQ to short-circuit internal data lines IO and ZIO.

Internal data lines IO and ZIO are provided with a preamplifier/write driver PA/WDV in preamplifier/write driver circuit PW#. Preamplifier/write driver PA/WDV includes a preamplifier PA rendered active in response to preamplifier activation signal PAE and column block select signal CBS, and a write driver WDV driving internal data lines IO and ZIO according to internal write data WD and ZWD when selected by column block select signal CBS. Write driver WDV, whose structure will be described in detail afterwards, drives internal data lines IO and ZIO to the voltage levels of high level sense power supply line HPL and low level sense power supply line LPL when selected.

Data line equalize designation signal ZIOEQ is rendered inactive when a column select operation is started. Therefore, internal data lines IO and ZIO are precharged and equalized to the level of sense power supply voltage Vdds.

Figure 15:
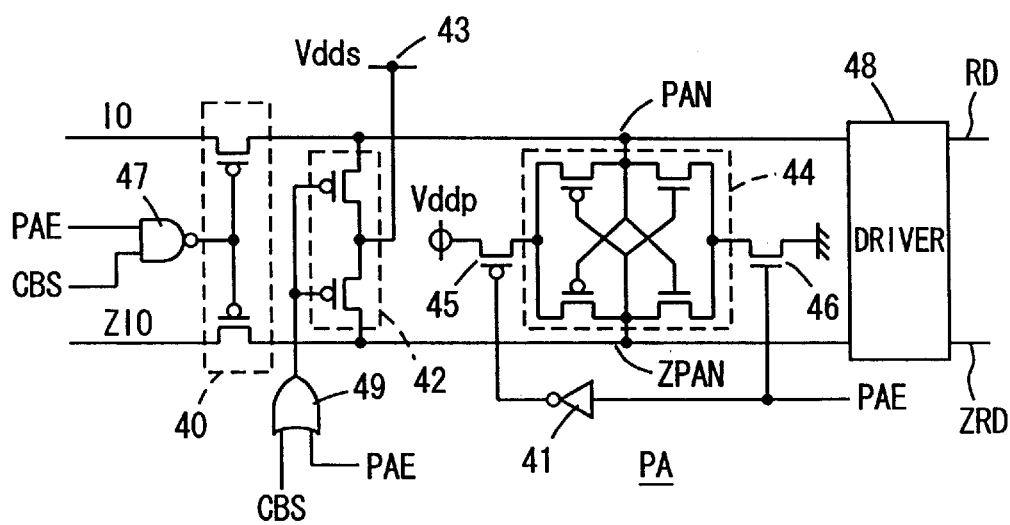
FIG. 15 shows a structure of a preamplifier PA in a readout circuit preamplifier/write driver PA/WDV of FIG. 14.

FIG. 15 shows a structure of preamplifier PA in readout circuit preamplifier/write driver PA/WDV of FIG. 14. Referring to FIG. 15, preamplifier PA includes a readout gate 40 coupling internal data lines IO and ZIO to preamplifier nodes PAN and ZPAN when rendered conductive, a pull up circuit 42 rendered active when preamplifier PA is inactive to pull up preamplifier nodes PAN and ZPAN to the level of voltage Vdds of node 43, Vdds being independent of voltage Vsan of high level sense power supply line HPL, a differential amplifier 44 amplifying the voltage difference of preamplifier nodes PAN and ZPAN when active, MOS transistors 45 and 46 rendering differential amplifier 44 active in response to activation of preamplifier activation signal PAE, and a driver 48 receiving the amplified data on preamplifier nodes PAN and ZPAN to drive the read data bus RD, ZRD.

Readout gate 40 is formed of a P channel MOS transistor, and is rendered conductive when the output signal of gate circuit 47 receiving preamplifier activation signal PAE and column block select signal CBS attains an L level. Gate circuit 47 generates a signal of an L level when preamplifier activation signal PAE is at an L level and column block select signal CBS is at an H level. More specifically, readout gate 40 is rendered conductive, only during period where a corresponding column block is selected and before differential amplifier 44 is rendered active, to couple internal data line IO and ZIO to preamplifier nodes PAN and ZPAN.

Pull-up circuit 42 is formed of P channel MOS transistors, rendered active when the output signal of OR circuit 49 receiving preamplifier activation signal PAE and column block select signal CBS attains an L level. More specifically, pull up circuit 42 is in an inactive state during the period where a corresponding column block is selected or differential amplifier 44 is activated, so that precharging of preamplifier nodes PAN and ZPAN is ceased. When either column block select signal CBS or preamplifier activation signal PAE is at an H level, preamplifier nodes PAE and ZPAE are disconnected from precharge power supply node 43.

Figure 16:
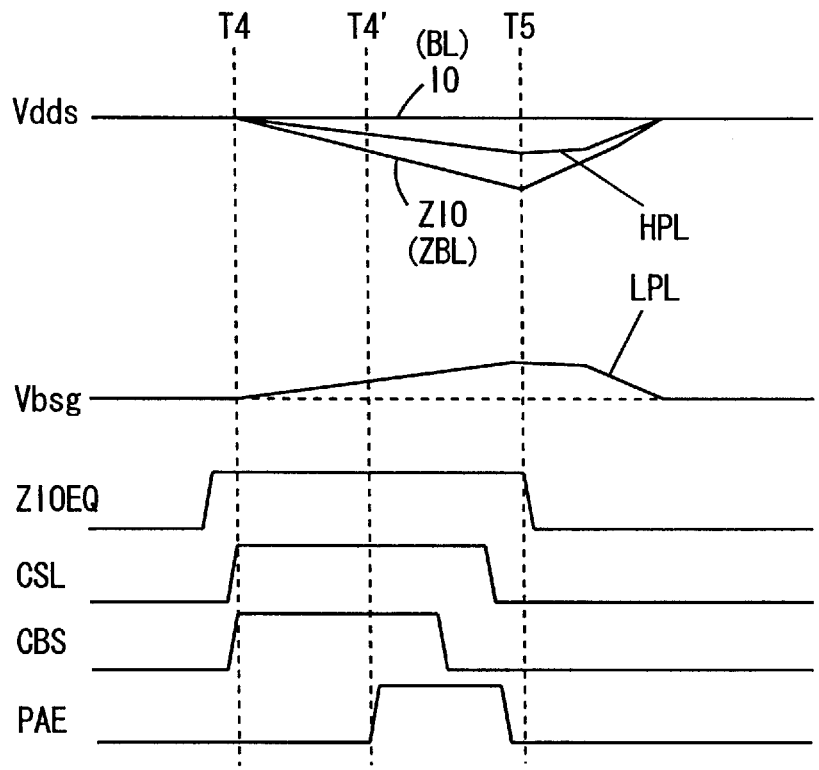
FIG. 16 represents voltage change of a sense power supply line and an internal data line during operation of the circuit of FIG. 15.

Differential amplifier 44 includes a pair of cross-coupled P channel MOS transistors and a pair of cross-coupled N channel MOS transistors. MOS transistor 45 is rendered conductive, when the output signal of an inverter 41 receiving preamplifier activation signal PAE attains an L level, to supply a periphery power supply voltage Vddp to differential amplifier 44. MOS transistor 46 conducts when preamplifier activation signal PAE attains an H level to supply ground voltage to differential amplifier 44. The operation of the preamplifier of FIG. 15 will now be described with reference to the signal waveform diagram of FIG. 16.

Consider the case where the sensing operation of bit lines BL and ZBL is completed and bit lines BL and ZBL are maintained at an H level and an L level, respectively, before time T4. The voltages of high level sense power supply line HPL and low level sense power supply line LPL are restored to the levels of sense power supply voltage Vdds and boosted sense ground voltage Vbsg, respectively. Data line equalize designation signal ZIOEQ is at an L level. Internal data lines IO and ZIO are precharged to the level of voltage Vdds on high level sense power supply line HPL.

When a column select operation is started, data line equalize designation signal ZIOEQ is pulled up to an H level and precharging of the internal data lines ends, followed by the driving of column select signal CSL and column block select signal CBS to an H level, prior to time T4. At time T4, bit lines BL and ZBL are connected to internal data lines IO and ZIO according to column select signal CSL. Bit line ZBL maintained at the L level is coupled to internal data line ZIO that is precharged to the level of voltage Vdds. The charge on internal data line ZIO (stored in parasitic capacitance) is discharged to low level sense power supply line LPL via N channel MOS transistors TQ2 and TQ3 of sense amplifier circuit S/A. As a result, the voltage level of internal data line ZIO is reduced whereas the voltage Vsan of low level sense power supply line LPL is increased from the level of boosted sense ground voltage Vbsg.

Bit line BL is set to the level of sense power supply voltage Vdds by sense amplifier circuit S/A. Therefore, the voltage of internal data line IO will not change even if column select gate CSG is turned on according to column select signal CSL.

The voltage change on internal data lines IO and ZIO are transmitted to preamplifier nodes PAN and ZPAN via readout gate 40 that is already made conductive.

When preamplifier activation signal PAE is pulled up to an H level at time T4', readout gate 40 is rendered non-conductive. The voltage difference reflecting the voltages of internal data lines IO and ZIO is kept at preamplifier nodes PAN and ZPAN to be amplified by preamplifier PA. Driver 48 performs a driving operation according to the voltages of preamplifier nodes PAN and ZPAN, whereby amplified data is sent to read data buses RD and ZRD.

At time T5, column select signal CSL is pulled down to an L level. Data line equalize designation signal ZIOEQ is also pulled down to an L level. The voltage levels of internal data lines IO and ZIO are increased towards the voltage level equal to voltage Vsap on high level sense power supply line HPL. In order to restore the voltage Vsap of high level sense power supply line HPL and internal data lines IO and ZIO to the level of voltage Vdds, it is clear that the amount of charge discharged from internal data line ZIO to low level sense power supply line LPL in a period from time T4 to time T5 must be compensated for.

Figure 17:
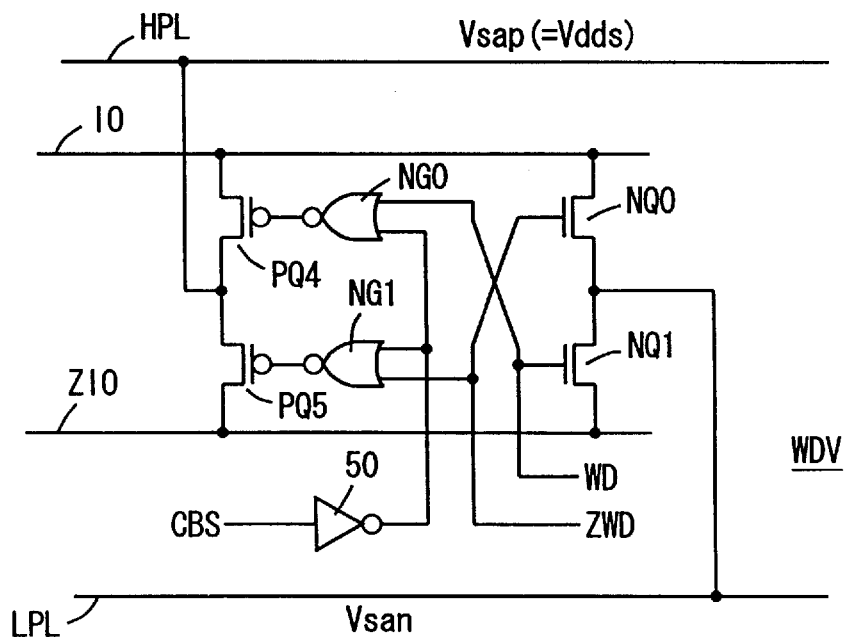
FIG. 17 shows a structure of a write drive circuit of the readout amplifier circuit/write drive circuit of FIG. 14.

FIG. 17 shows a structure of a write driver WDV in preamplifier/write driver PA/WDV of FIG. 14. Referring to FIG. 17, write driver WDV includes P channel MOS transistors PQ4 and PQ5 connected in series between internal data lines IO and ZIO, an NOR circuit NG0 receiving an inverted signal of column block signal CBS applied via inverter 50 and internal write data WD, a NOR circuit NG1 receiving the output signal of inverter 50 and internal write data ZWD, and N channel MOS transistors NQ0 and NQ1 connected in series between internal data lines IO and ZIO. The output signal of NOR circuit NG0 is applied to a gate of P channel MOS transistor PQ4. The output signal of NOR circuit NG1 is applied to a gate of P channel MOS transistor PQ5. MOS transistor NQ0 receives complementary internal write data ZWD at a gate thereof. MOS transistor NQ1 receives write data WD at a gate thereof P channel MOS transistors PQ4 and PQ5 transmit the voltage Vsap (=Vdds) on high level sense power supply line HPL to corresponding internal data lines IO and ZIO when conductive. N channel MOS transistors NQ0 and NG1 transmit the voltage Vsan (=Vbsg) on low level sense power supply line LPL to corresponding internal data lines IO and ZIO.

Figure 18:
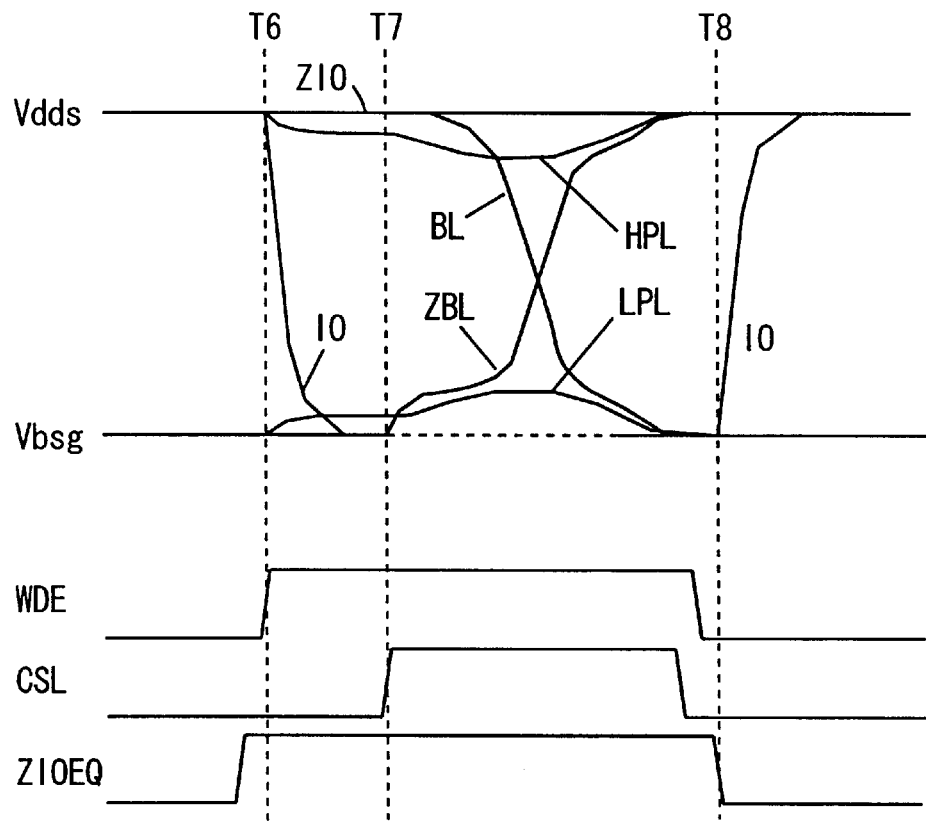
FIG. 18 is a signal waveform diagram representing the operation of the circuits shown in FIGS. 15 and 17.

Internal write data WD and ZWD are both set at a low level before data writing. Write amplifier circuit 37 shown in FIG. 13 sets internal write data WD and ZWD to a high level or a low level according to external write data when active. The operation of write driver WDV of FIG. 17 will be described with reference to the signal waveform diagram of FIG. 18.

An internal data line precharge/equalize circuit IOEQ is provided for internal data lines IO and ZIO, as shown in FIG. 14. Therefore, prior to time T6, internal data lines IO and ZIO are both precharged and equalized to the level of sense power supply voltage Vdds according to data line equalize designation signal ZIOEQ. Consider the state where H level data is maintained at bit line BL and L level data is maintained at complementary bit line ZBL at the present stage.

At time T6, data line equalize designation signal ZIOEQ attains an H level. The precharge/equalize operation on internal data lines IO and ZIO is completed. Write driver WDV transmits L level data and H level data to internal data line IO and complementary internal data line ZIO, respectively. More specifically, when internal write data WD corresponds to an L level and internal write data ZWD corresponds to an H level, MOS transistors NQ0 and PQ5 in write driver WDV of FIG. 17 are turned on. Responsively, charge flows out from internal data line IO to low level sense power supply line LPL, and the voltage level of internal data line ZIO is maintained at voltage Vsap on high level sense power supply line HPL, i.e., sense power supply voltage Vdds, by MOS transistor PQ5.

Since internal data lines IO and ZIO are precharged to the level of sense power supply voltage Vdds, the voltage level of internal data line IO is reduced whereas complementary internal data line ZIO maintains the level of sense power supply voltage Vdds.

At time T7, column select signal CSL is pulled up to an H level, and selected bit lines BL and ZBL are connected to internal data lines IO and ZIO. Since the current drivability of write driver WD is larger than the current drivability of sense amplifier circuit S/A, the voltage levels of bit lines BL and ZBL change according to the voltage levels of internal data lines IO and ZIO. More specifically, bit line BL is driven to an L level and the voltage level of complementary bit line ZBL increases. In this case, charge is transferred (flow of through current) from high level sense power supply line HPL to low level sense power supply line LPL transiently in write driver WDV and sense amplifier circuit S/A. Eventually, bit line BL is driven to the level of voltage Vsan of low level sense power supply line LPL whereas bit line ZBL is driven to the level of voltage Vsap on high level sense power supply line HPL. The voltage levels of bit lines BL and ZBL are latched by sense amplifier circuit S/A.

At time T8, column select signal CSL is pulled down to an L level. Then, write drive enable signal WDE is pulled down to an L level. Responsively, internal write data WD and ZWD are both set to an L level. Therefore, the voltage level of internal data line IO is restored to the level of voltage Vsap of high level sense power supply line HPL by data line precharge/equalize circuit IOEQ.

Therefore, in a data write operation, the charge is only transferred from high level sense power supply line HPL to low level sense power supply line LPL. The amount of charge flowing out from high level sense power supply line HPL is equal to the amount of charge flowing into low level sense power supply line LPL. The total of the amount of charge flowing into low level sense power supply line LPL during the discharging operation of internal data line IO by write driver WDV in a period from time T6 to time T7 and the amount of charge flowing into low level sense power supply line LPL from high level sense power supply line HPL generated during the inverting operation of the latch data of sense amplifier circuit S/A from time T7 to time T8 is equal to the amount of charge required to restore internal data line IO and high level sense power supply line HPL to the original level of voltage Vdds during the data line precharge operation starting at time T8.

Figure 19:
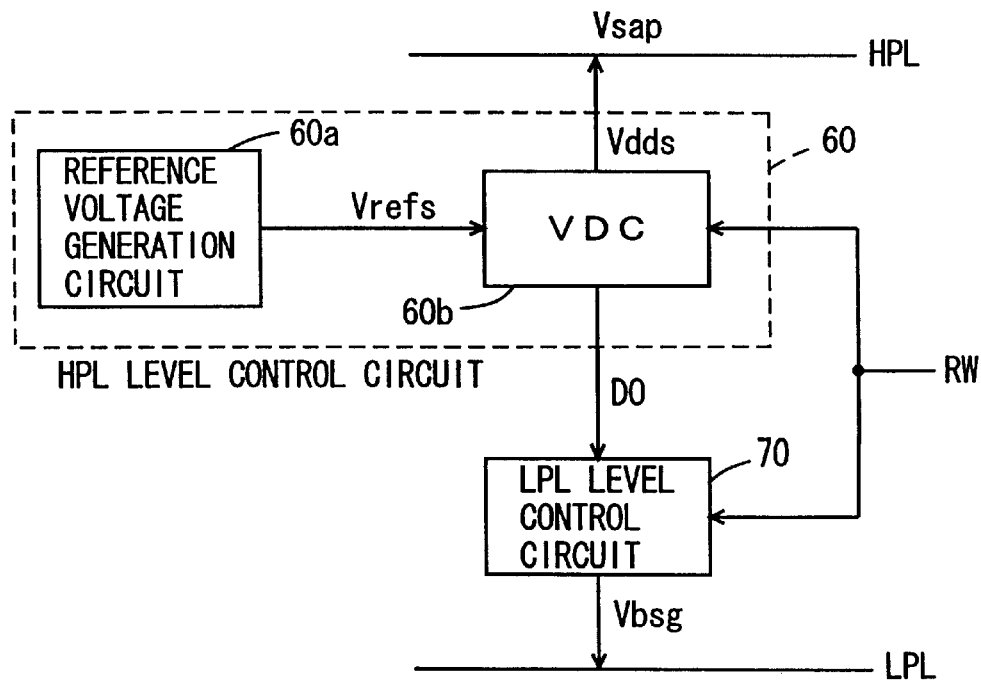
FIG. 19 schematically shows a structure of a sense power supply voltage control circuit according to a fourth embodiment of the present invention.

FIG. 19 schematically shows a structure of a sense power supply voltage generation unit according to the fourth embodiment of the present invention. The sense power supply voltage generation unit of FIG. 19 includes an HPL level control circuit 60 to set the voltage level of high level sense power supply line HPL to a reference voltage Vrefs, and an LPL level control circuit 70 monitoring the amount of charge supplied to high level sense power supply line HPL by HPL control circuit 60, and discharging charge corresponding to the monitored amount to the ground node from low level sense power supply line LPL.

Similar to the first embodiment, HPL level control circuit 60 includes a reference voltage generation circuit 60a generating reference voltage Vrefs, and an internal voltage-down converter (VDC) 60b supplying current to high level sense power supply line HPL according to the result of comparison between the reference voltage Vrefs and the voltage Vsap. The structures of reference voltage generation circuit 60a and internal voltage-down converter 60b are similar to those shown in FIGS. 5 and 6.

Internal voltage-down converter 60b is rendered active in response to a column access designation signal RW instead of sense amplifier activation signal SE. Column access designation signal RW attains an active state until completion of the internal data write/read operation when a column access designation signal (column access command) designating data writing or reading is applied. LPL level control circuit 70 is rendered active according to activation of column access designation signal RW to discharge charge from low level sense power supply line LPL to the ground node according to a comparison result designation signal DO from the comparator in internal voltage-down converter 50b. LPL level control circuit 70 has a structure similar to that shown in FIG. 7, and includes a current drive transistor for monitoring, and a current mirror circuit conducting the mirror current of the current supplied from this current drive transistor between low level sense power supply line LPL and the ground node.

Figure 20:
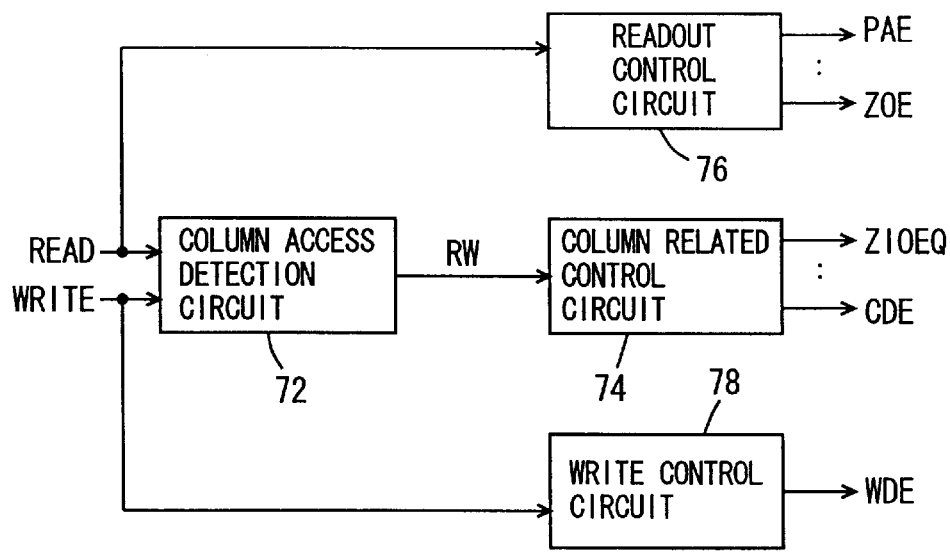
FIG. 20 schematically shows a structure of the portion generating each control signal of FIG. 14.

FIG. 20 schematically shows a structure of a column access control unit controlling the operation related to data writing/reading. Referring to FIG. 20, the column access control unit includes a column access detection circuit 72 receiving an externally applied read command READ designating data readout and write command WRITE designating data writing, for detecting whether a column access is instructed to carry out column selection operation based on the result of detection, a readout control circuit 76 generating a signal required for data readout according to read command READ, and a write control circuit 78 generating a control signal required for data writing according to write command WRITE. A column access designation signal RW is generated from column access detection circuit 72 to be applied to column related control circuit 74. Column related control circuit 74 renders data line equalize designation signal ZIOEQ inactive and renders column decoder enable signal CDE active upon activation of column access designation signal RW. In response to activation of a column decoder enable signal CDE, a column decoder not shown is rendered active to decode a column address signal, and the corresponding column select signal CSL and column block select signal CBS are driven to a selected state.

Read control circuit 76 is responsive to a read command READ to render preamplifier activation signal PAE and output enable signal ZOE active at predetermined timings. Write control circuit 78 is responsive to a write command WRITE to render write driver enable signal WDE active at a predetermined timing. Therefore, column access designation signal RW is made active at least during the period of time when data reading on an internal data line and amplification of data on the internal data lines are carried out, and then isolation between the internal data lines and the preamplifier is completed. In a data write operation, column access designation RW is rendered active from time T6 shown in FIG. 18 to the time after the completion of the precharging of the internal data lines after time T8 shown in FIG. 18.

Figure 21A:
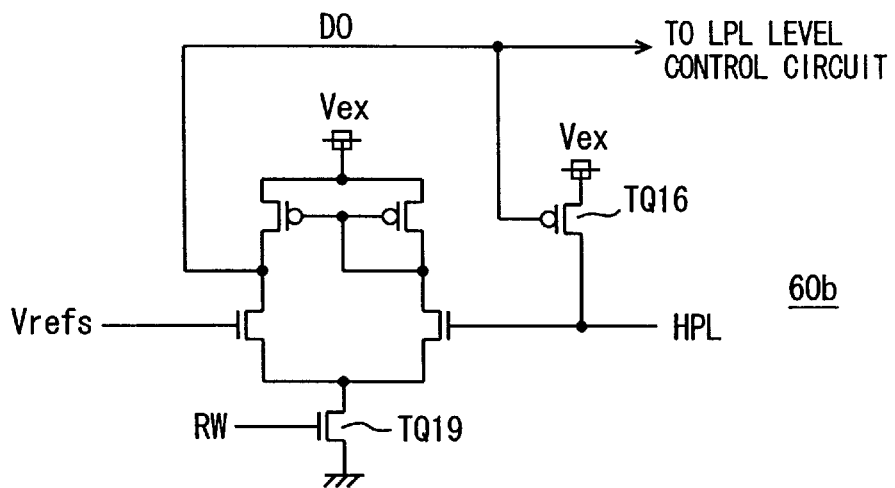
FIG. 21A shows a structure of an internal voltage-down converter of FIG. 19.

FIG. 21A shows a structure of internal voltage-down circuit 60b of FIG. 19. Internal voltage-down circuit 60b of FIG. 21A has a structure similar that of the internal voltage-down circuit of the first embodiment shown in FIG. 6. A column access designation signal RW is applied to the gate of activation MOS transistor TQ19 instead of sensing operation activation signal SE. Current is supplied to high level sense power supply line HPL by current drive transistor TQ16 according to signal DO.

Figure 21B:
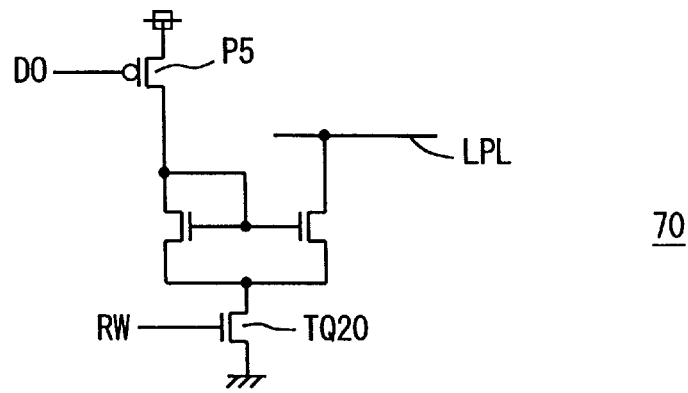
FIG. 21B shows a structure of the LPL level control circuit of FIG. 19.

FIG. 21B shows a structure of LPL level control circuit 70 of FIG. 19. LPL level control circuit 70 of FIG. 21 has a structure similar to that of LPL level control circuit 7 of FIG. 7. A column access designation signal RW is applied to the gate of activation MOS transistor TQ20 instead of sensing operation activation signal SE. LPL level control circuit 70 of FIG. 21B is responsive to output signal DO of the comparator in internal voltage-down converter 70b of FIG. 21A, for monitoring the amount of charge supplied by current drive MOS transistor PQ16 in internal voltage-down converter 60b by the drive P channel MOS transistor P5 to adjust the voltage level of low level sense power supply line LPL according to the monitoring result.

Modification

Figure 22:
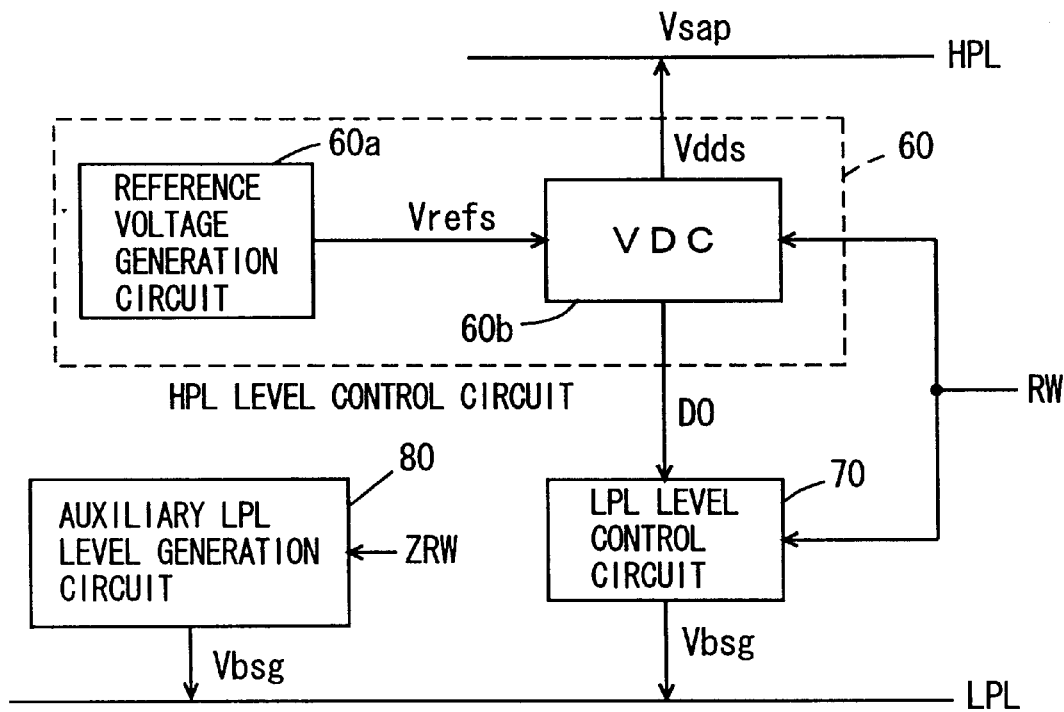
FIG. 22 shows a modification of the fourth embodiment of the present invention.

FIG. 22 schematically shows a structure of a modification of the fourth embodiment.

In the structure of FIG. 22, an auxiliary LPL level generation circuit 80 is provided, activated, when inverted signal ZRW of column access designation signal RW is rendered active, to generate the boosted sense ground voltage Vbsg on low level sense power supply line LPL. The structure of auxiliary LPL level generation circuit 80 is similar to the structure of auxiliary LPL level generation circuit shown in FIG. 10 or 11. By comparison with a reference voltage, boosted sense ground voltage Vbsg is generated on low level sense power supply line LPL. By adjusting the voltage level of low level sense power supply line LPL using auxiliary LPL level generation circuit 80 when column access designation signal RW is inactive, the voltage of low level sense power supply line LPL can be maintained more accurately at the level of boosted sense ground voltage Vbsg.

According to the fourth embodiment of the present invention, the amount of transferred charge from the high level sense power supply line is monitored to transfer charge to the low level sense power supply line according to the monitoring result in a column access operation where data writing or reading is carried out. Thus, the change in the voltage level of the low level sense power supply line caused by data writing or reading can be compensated for.

Fifth Embodiment

Figure 23:
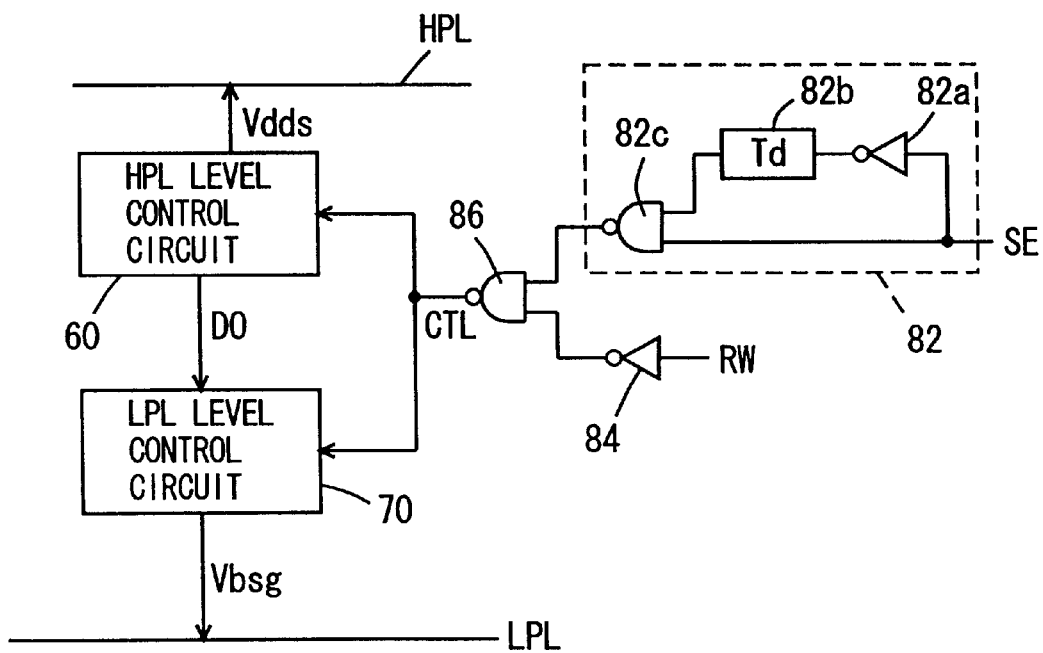
FIG. 23 schematically shows a structure of a sense power supply voltage control circuit according to a fifth embodiment of the present invention.

FIG. 23 schematically shows a structure of a sense power supply voltage control unit according to a fifth embodiment of the present invention. In FIG. 23, a power supply adjustment control unit which is rendered active during a sensing operation period and a column access period is provided to HPL level control circuit 60 and to LPL level control circuit 70. The structure of HPL level control circuit 60 and LPL level control circuit 70 is similar to the structure shown in FIGS. 19, 20, and 21B.

The sense power supply voltage control unit includes an inverter 84 receiving column access designation signal RW, a one shot pulse generation circuit 82 generating a one shot pulse signal in response to activation of sensing operation activation signal SE, and a NAND circuit 86 receiving output signals of inverter 84 and one shot pulse generation circuit 82. A control signal CTL to HPL level control circuit 60 and LPL level control circuit 70 is outputted from NAND circuit 86.

Figure 24:
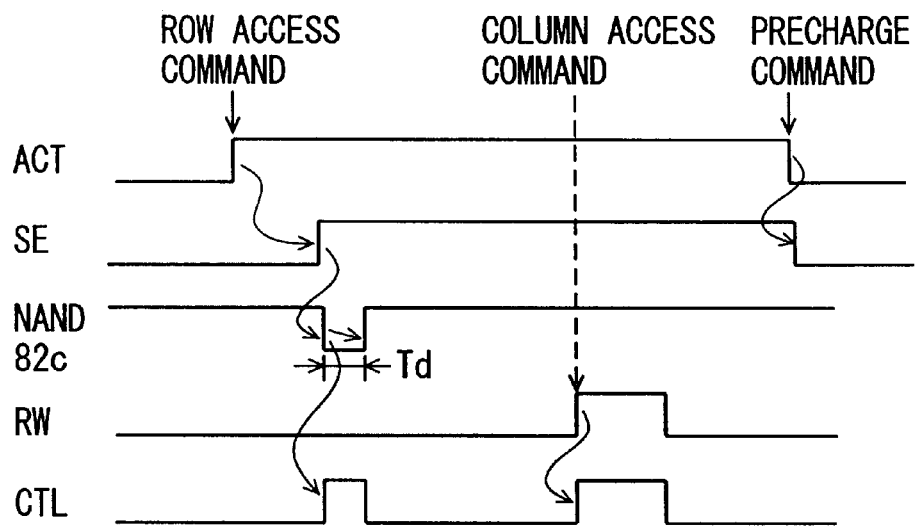
FIG. 24 is a signal waveform diagram representing the operation of the circuit of FIG. 23.

One shot pulse generation circuit 82 includes an inverter 82a receiving sensing operation activation signal SE, a delay circuit 82b delaying the output signal of inverter 82a by a delay time Td, and a NAND circuit 82c receiving the output signal of delay circuit 82b and sensing operation activation signal SE. A signal that attains an L level for a predetermined time including a sensing operation period is outputted from one shot pulse generation circuit 82 when sensing operation activation signal SE is pulled up to an H level. The operation of the sense power supply voltage control unit of FIG. 23 will now be described with reference to the signal waveform diagram of FIG. 24.

In response to application of a row access command (active command) designating row selection, a row activation signal ACT activating an internal row select operation is rendered active. Responsively, a row select operation is carried out in response to activation of row activation signal ACT. Sensing operation activation signal SE is driven to an active state of an H level at a predetermined timing in response to activation of row activation signal ACT. When sensing operation activation signal SE is rendered active at an H level, a one shot pulse signal that is pulled down to an L level for a predetermined time is output from one shot pulse generation circuit 82 (from NAND circuit 82c). The pulse width of the pulse signal generated by one shot pulse generation circuit 82 corresponds to the delay time Td of delay circuit 82b. This pulse width Td covers the sensing operation period of sense amplifier circuit, i.e., the period when the sense current flows.

Therefore, control signal CTL from NAND circuit 86 attains an H level in the operation of the sense amplifier circuit. HPL level control circuit 60 and LPL level control circuit 70 are rendered active, whereby the voltage level of sense power supply lines of HPL and LPL is adjusted. When the sensing operation is completed and the sense amplifier circuit attains a latch state, the one shot pulse signal is pulled up to an H level and control signal CTL is pulled down to an L level. In response, HPL level control circuit 60 and LPL level control circuit 70 are rendered inactive to cease the voltage adjusting operation.

When a column access command designating column selection (a read command of reading out data or a write command to write out data) is applied, column access designation signal RW is rendered active. The internal column selection and data writing or reading are executed.

In response to activation of column access designation signal RW, control signal CTL from NAND circuit 86 is pulled up to an H level. HPL level control circuit 60 and LPL level control circuit 70 are rendered active again, whereby the voltage levels of sense power supply lines HPL and LPL are adjusted. By rendering HPL level control circuit 60 and LPL level control circuit 70 active only during the period where the voltage levels of the sense power supply lines change, such as a sensing operation and a data write/read operation periods, and by discharging an amount of charge corresponding to the amount of charge supplied to high level sense power supply line HPL by HPL level control circuit 60 through low level sense power supply line LPL, the voltage of low level sense power supply line LPL can be set to the level of boosted sense ground voltage Vbsg stably with the minimum current consumption caused by through-current of HPL level control circuit 60 and LPL level control circuit 70.

Sixth Embodiment

Figure 25:
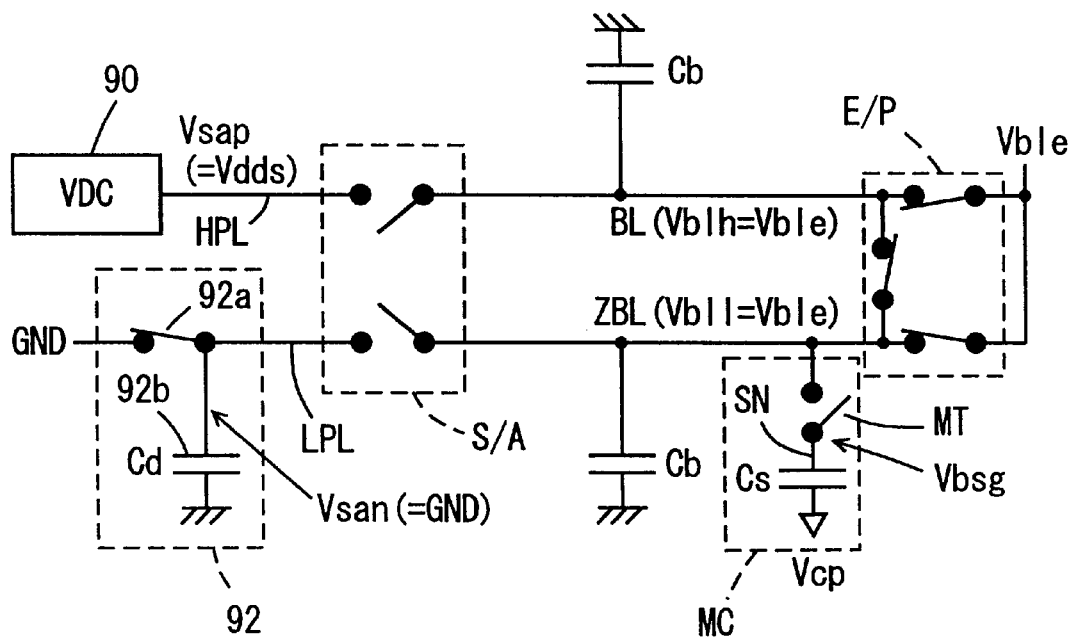
FIG. 25 is a diagram to explain the PCAS scheme employed in a sixth embodiment of the present invention.

FIG. 25 schematically shows a structure of a sense power supply circuit of the PCAS scheme employed in a sixth embodiment of the present invention. In FIG. 25, a structure of the portion related to one bit line pair BL and ZBL is shown. An internal voltage-down converter 90 is coupled to a high level sense power supply line HPL. A low level sense power supply circuit 92 is coupled to a low level sense power supply line LPL.

Low level sense power supply circuit 92 includes a capacitor 92b having a capacitance value Cd, and a switch circuit 92a coupling low level sense power supply line LPL to the ground node in a standby state, and disconnecting low level sense power supply line LPL from the ground node in an active cycle.

A bit line precharge/equalize circuit E/P is provided to bit line pair BL and ZBL. In FIG. 25, the MOS transistors of each circuit are represented by mechanical switches.

Consider the voltage of each signal line in a standby state in the structure of FIG. 25. In the standby state, sense amplifier circuit S/A is at an inactive state, the sense activation transistors are off, and sense power source lines HPL and LPL are disconnected from bit lines BL and ZBL. In bit line equalize/precharge circuit E/P, all the internal precharge transistors and equalize transistors are on, and. intermediate voltage Vble is transmitted to bit lines BL and ZBL. In memory cell MC, access transistor MT is off, and the voltage Vbsg is now stored in storage node SN of memory cell capacitor Cs.

In low level sense power supply circuit 92, switch circuit 92a couples low level sense power supply line LPL with the ground node, and ground voltage GND is transmitted to the electrode node of a capacitor 92b. In low level sense power supply circuit 92, the voltage between the electrode nodes of capacitor 92b is the ground voltage. Since the voltage difference between these electrode nodes becomes 0, the amount of accumulated charge is 0. In this precharged state, charge by intermediate voltage Vble is stored in parasitic capacitance Cb of each of bit lines BL and ZBL. In memory cell capacitor Cs, charge corresponding to the difference between cell plate voltage Vcp and boosted sense ground voltage Vbsg is accumulated in storage node SN.

Figure 26:
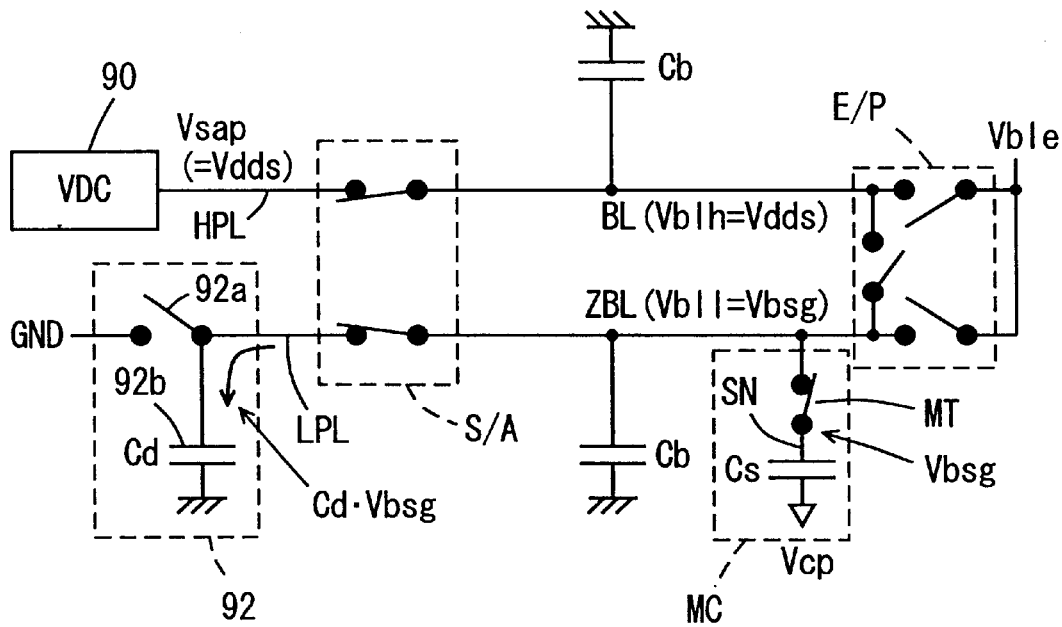
FIG. 26 is a diagram representing the voltage of each signal line when a sensing operation of the PCAS scheme is completed.

FIG. 26 represents the state of each circuit at the completion of a sensing operation. In sensing operation, switch circuit 92a in low level sense power supply circuit 92 is rendered non-conductive, whereby low level sense power supply line LPL is disconnected from the ground node. L level data is stored in memory cell MC, and bit line BL is driven to a high level. Bit line equalize/precharge circuit E/P is in an inactive state, and each transistor therein is off.

When the sensing operation is completed, voltage Vblh of bit line BL is equal to high level sense power supply voltage Vdds. Voltage Vbll of bit line ZBL attains the level of boosted sense ground voltage Vbsg. Voltage Vbll of bit line ZBL is generated by the re-distribution of the charge between memory cell capacitor Cs and the bit line load capacitance Cb and capacitor 92b. With Cd being the capacitance value of capacitor 92b, the following equation is obtained from the conservation of electric charge.

$$Cb \cdot Vble + Cd \cdot 0 + Cs \cdot Vbsg = (Cb + Cd + Cs) \cdot Vbsg \quad (8)$$

The following equation (9) is obtained by rearranging the above equation (8).

$$Cb \cdot (Vdds - Vbsg)/2 = Cd \cdot Vbsg \quad (9)$$

In equation (9), the left side represents charge transferred from bit line ZBL, and the right side represents the amount of transferred charge in capacitor 92b. Voltage Vbll of bit line ZBL has its level set such that the amount of transfer charge of bit line ZBL is made equal to the amount of transfer charge of capacitor 92b. Here, intermediate voltage Vble is (Vdds+Vbsg)/2.

In other words, the value of the capacitance value Cd required for capacitor 92b can be determined uniquely if the level of voltage Vbsg required on the standpoint of the data retention characteristics of the memory cell is determined.

The above equation (9) lacks the term of memory cell capacitor Cs. Therefore, the entire required value of capacitance Cd of capacitor 92b is determined not depending upon the data pattern written in the memory cells in the block subject to the sensing operation (block-division (partial activation) operation is assumed). Assuming that the number of bit line pairs in the memory block subject to the sensing operation is N, and the required capacitance value of capacitor 92b is Cdl, the following equation (10) is derived from equation (9).

$$N \cdot Cb \cdot (Vdds - Vbsg)/2 = Cdl \cdot Vbsg \quad (10)$$

If capacitance value Cdl can be realized as the capacitance value Cd of capacitor 92b according to equation (10), the voltage Vbsg of L level data can be generated accurately by the sensing operation.

Focusing on gate-source voltage Vgs of the N channel MOS transistor in sense amplifier circuit S/A at the start of a sensing operation, the voltage Vgs is allowed to be increased by the amount corresponding to the value of this boosted sense ground voltage Vbsg. Therefore, the sensing operation can be speeded up. More specifically, when low level sense power supply line LPL is maintained at the level of boosted sense ground voltage Vbsg in a standby state, the gate-source voltage Vgs of the N channel MOS transistor in the sense amplifier circuit becomes Vble−Vbsg. If low level sense power supply line LPL is precharged to the level of ground voltage GND in a standby state, the gate-source voltage Vgs of the N channel MOS transistor in the sense amplifier circuit becomes equal to intermediate voltage Vble immediately before the start of the sensing operation.

According to the PCAS scheme, low level sense power supply line LPL is maintained at the level of ground voltage GND during the precharge period and need not be held at the level of boosted sense ground voltage Vbsg. Therefore, the Vbsg generation circuit is dispensable to allow reduction of current consumption.

Using this low level sense power supply circuit 92, the voltage level of bit line ZBL is set to the level of boosted sense ground voltage Vbsg in a sensing operation. In a write/read operation, the amount of charge supplied to high level sense power supply line HPL by the circuit that generates high level sense power supply voltage, is monitored to draw out charge corresponding to the monitored charge amount from low level sense power supply line LPL, similar to the previous fourth embodiment.

Figure 27:
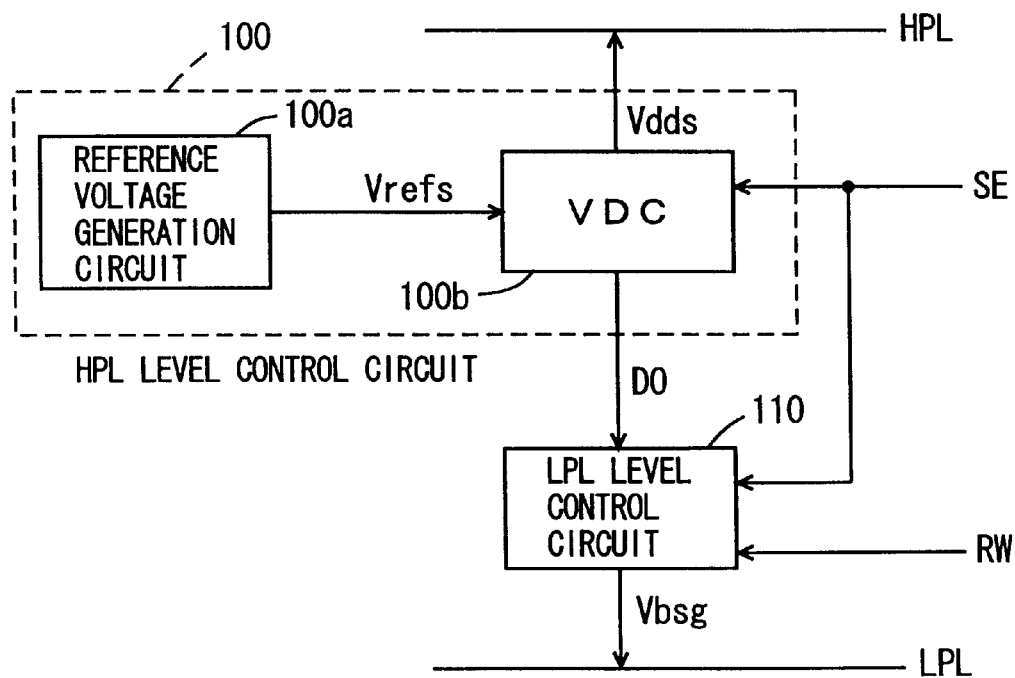
FIG. 27 schematically shows a structure of a sense power supply voltage control circuit according to the sixth embodiment of the present invention.

FIG. 27 schematically shows a structure of a sense power supply voltage control unit of the sixth embodiment. Referring to FIG. 27, the sense power supply voltage control unit includes an HPL level control circuit 100 rendered active, when sensing operation activation signal SE is active, to supply charge to high level sense power supply line HPL, and an LPL level control circuit 110 rendered active, according to sensing operation activation signal SE and column access designation signal RW, to discharge charge from low level sense power supply line LPL. LPL level control circuit 110 includes the low level sense power supply circuit 92 of FIG. 26, couples low level sense power supply line LPL to the ground node when sensing operation activation signal SE is inactive, and draws out charge from the capacitor when sensing operation activation signal SE is at an active state of an H level. LPL level control circuit 110 monitors the amount of charge supplied to high level sense power supply line HPL according to output signal DO from HPL level control circuit 100 when column access designation signal RW is active to discharge charge from low level sense power supply line LPL according to the monitoring result.

HPL level control circuit 100 includes a reference voltage generation circuit 110a generating reference voltage Vrefs, and an internal voltage-down converter 100b comparing reference voltage Vrefs with the voltage of high level sense power supply line HPL to supply charge to high level sense power supply line HPL according to the comparison result, and preferably supplies the charge to high level sense power supply line HPL in response to activation of sensing operation activation signal SE.

Figure 28:
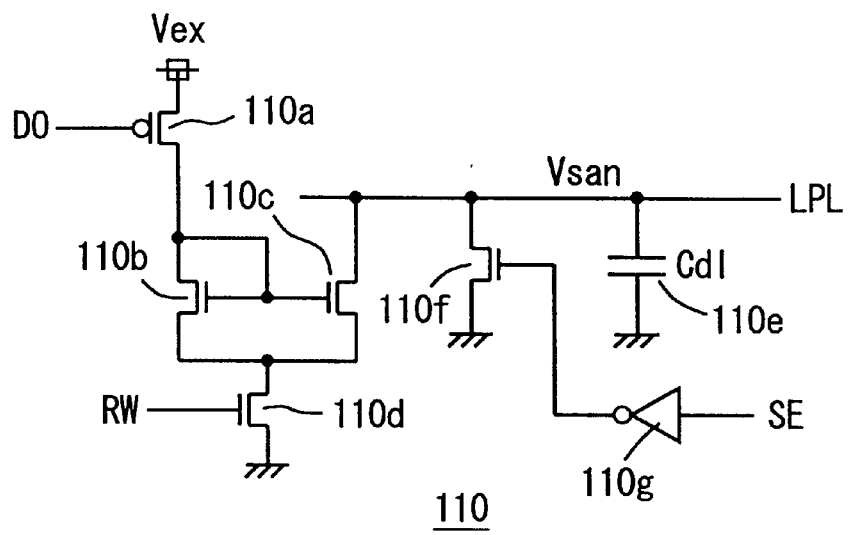
FIG. 28 shows a structure of an LPL level control circuit of FIG. 27.

FIG. 28 shows a structure of LPL level control circuit 110 of FIG. 27. Referring to FIG. 28, LPL level control circuit 110 includes a P channel MOS transistor 110a supplying current from an external power supply node according to comparison result indicating signal DO from internal voltagedown converter 100b in HPL level control circuit 100, N channel MOS transistors 110b and 110c forming a current mirror stage to generate a mirror current of the current from MOS transistor 110a, an N channel MOS transistor 110d rendering active the current mirror circuit in response to activation of column access designation signal RW, a capacitor 110e coupled to low level sense power supply line LPL, an inverter 110g receiving sensing operation activation signal SE, and an N channel MOS transistor 110f coupling low level sense power supply line LPL to the ground node according to the output signal of inverter 110g.

In the structure of LPL level control circuit 110 of FIG. 28, sensing operation activation signal SE and column access designation signal RW are both at an L level in a standby state. Therefore, low level sense power supply line LPL is coupled to the ground node by MOS transistor 110f. The voltage Vsan on low level sense power supply line LPL is at the level of the ground voltage.

When sensing operation activation signal SE is driven to an H level, the output signal of inverter 110g is pulled down to an L level, whereby MOS transistor 110f is turned off. Column access designation signal RW is at an inactive state of an L level. Therefore, in the sensing operation, the charge from low level sense power supply line LPL is absorbed by or accumulated in capacitor 110e. In order to set the voltage Vsan of low level sense power supply line LPL at the level of boosted sense ground voltage Vbsg, capacitance value Cdl of capacitor 110e is set to the capacitance value satisfying the foregoing equation (10).

When sensing operation activation signal SE is at an active state of the H level, the voltage level of low level sense power supply line LPL is maintained at the level of boosted sense ground voltage Vbsg by capacitor 110e.

In a column access of the data write/read operation, column access designation signal RW attains an H level, and the current mirror circuit stage formed of MOS transistors 110b and 110c operates. In the column access of the data write/read operation, HPL level control circuit 100 is kept active by sensing operation activation signal SE, and HPL level control circuit 100 operates when data write/read is carried out. More specifically, in the column access of the data write/read operation, HPL level control circuit 100 monitors the amount of charge supplied to high level sense power supply line HPL. Charge corresponding to the monitoring result is discharged from low level sense power supply line LPL to the ground node via MOS transistors 110c and 110d. Therefore, the voltage change in low level sense power supply line LPL caused by the change in the voltage of high level sense power supply line HPL caused by the column access operation after the sensing operation is compensated for by MOS transistors 110a–110d. It is to be noted that MOS transistor 110f and capacitor 110e correspond to low level sense power supply circuit 92 of FIG. 26.

Figure 29:
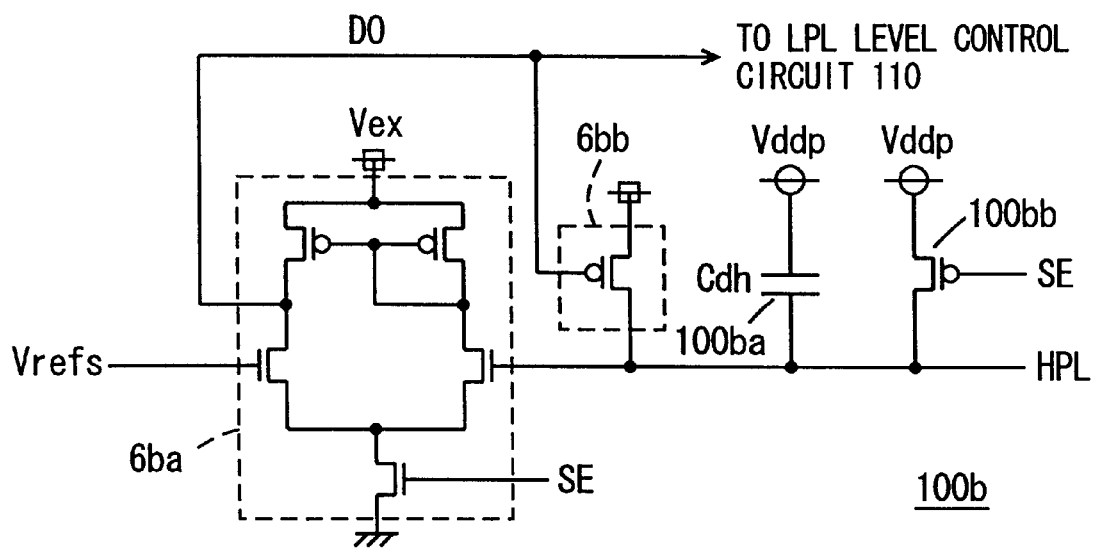
FIG. 29 shows a structure of an internal voltage-down converter of FIG. 27.

FIG. 29 shows a structure of internal voltage-down converter (VDC) 100b in HPL level control circuit 100 of FIG. 27. Referring to FIG. 29, internal voltage-down converter 100b includes a comparator 6ba responsive to activation of sensing operation activation signal SE for comparing the voltage on high level sense power supply line HPL with the reference voltage Vrefs, a current drive circuit 6bb supplying current from the external power supply node to high level sense power supply line HPL according to output signal DO of comparator 6ba, a capacitor 100ba connected between the periphery power supply node and high level sense power supply line HPL, and a P channel MOS transistor 100bb rendered conductive, when sensing operation activation signal SE is inactive, to couple high level sense power supply line HPL to the periphery power supply node. Capacitor 100ba has a capacitance value Cdh. Periphery power supply voltage Vddp is applied to the periphery power supply node, and is used by a peripheral circuitry such as a decoder, and is generated from the external power supply voltage.

High level sense power supply line HPL is coupled to the periphery power supply node by MOS transistor 100bb to be precharged to the level of periphery power supply voltage Vddp in a standby state. Upon starting of sensing operation, redistribution of charge is effected using capacitor 100ba. High level sense power supply line HPL is set to the level of sense power supply voltage Vdds in a sensing operation. Therefore, capacitance value Cdh of capacitor 100ba is represented from the following equation (11) from the assumption of the previous equation (10).

$$N \cdot Cb \cdot (Vdds - Vbsg)/2 = Cdh \cdot (Vddp - Vdds) \quad (11)$$

By appropriately combining periphery power supply voltage Vddp and capacitance value Cdh of capacitor 100ba according to equation (11), the voltage Vsap on high level sense power supply line HPL can be set to the level of sense power supply voltage Vdds accurately.

By using the combination of equations (10) and (11), the charge required to stabilize the voltages of sense power supply lines HPL and LPL can all be supplied by capacitors 110e and 100ba.

When such a capacitor 100ba is used, the response speed of comparator 6ba and current drive circuit 6bb and the current supply ability can be set low enough. More specifically, the size (channel width) of current drive circuit 6bb can be reduced, which allows reduction of the size of each transistor (channel width) of comparator 6ba and of the through current. As a result, the area penalty and current consumption can be reduced.

Sensing operation activation signal SE maintains the active state in a column access operation. Therefore, even if the voltage level of high level sense power supply line HPL changes in the data write/read operation, HPL level control circuit 100b operates to compensate for the voltage change in high level sense power supply line HPL by comparator 6ba and current drive circuit 6bb included therein. If the capacitance value of capacitor 100ba is large enough, the voltage change of high level sense power supply line HPL can be set low enough.

In the sixth embodiment of the present invention, a capacitor is used to generate the low level sense power supply voltage. The voltage of the low level sense power supply line can be set to a desired voltage level with low current consumption accurately. By providing a capacitor at the high level sense power supply line, the complexity of the sense power supply circuit of the HPL level control circuit can be reduced to allow reduction of the current consumption. In a column access operation, the amount of current supplied to the high level sense power supply line is monitored, and charge is discharged from the low level sense power supply line to the ground node according to the monitoring result. Therefore, variation in the voltage level of the low level sense power supply line can be sufficiently suppressed from the start of sensing operation to the column access operation sufficiently accurately.

Seventh Embodiment

Figure 30:
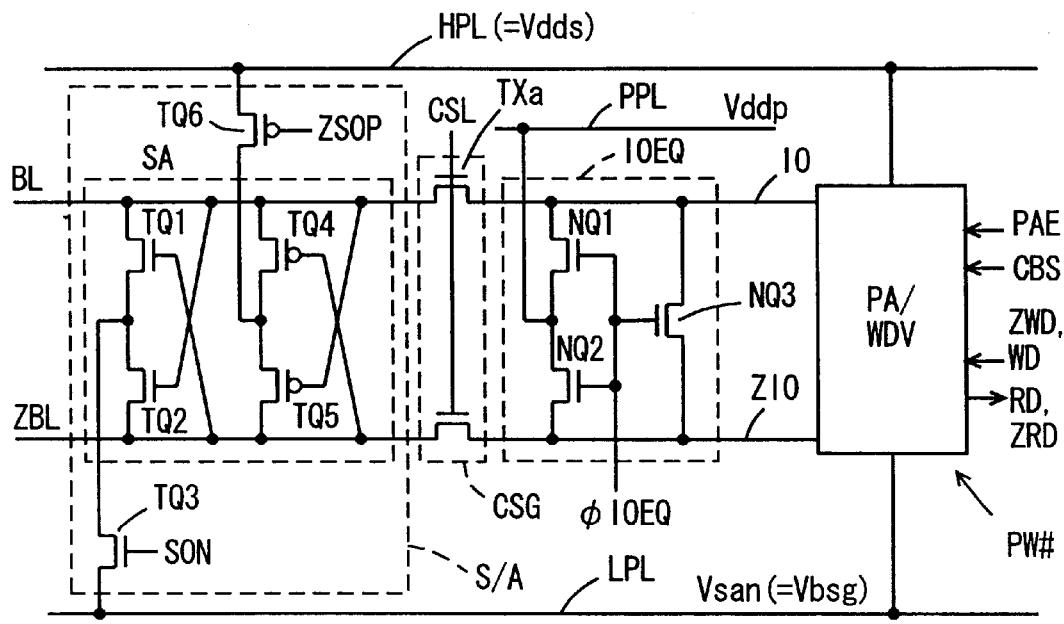
FIG. 30 schematically shows a structure of the portion related to data writing/reading of a semiconductor memory device according to a seventh embodiment of the present invention.

FIG. 30 shows a structure of the data write/read unit of the semiconductor memory device according to a seventh embodiment of the present invention. In the structure of FIG. 30, data line precharge/equalize circuit IOEQ provided corresponding to internal data lines IO and ZIO includes N channel MOS transistors NQ1–NQ3. Data line precharge/equalize circuit IOEQ precharges and equalizes internal data lines IO and ZIO at a voltage level lower than periphery power supply voltage Vddp on periphery power supply line PPL by threshold voltage Vth of MOS transistors NQ1–NQ3. Periphery power supply voltage Vddp higher than sense power supply voltage Vdds satisfies the following relationship.

$$Vddp > Vdds > Vddp - Vth$$

where Vth represents the threshold voltage of each of MOS transistors NQ1–NQ3 in the transfer gate transistor of column select gate CSG and data line precharge/equalize circuit IOEQ. Read amplifier circuit/write drive circuit PA/WDV has a structure identical to that shown in FIGS. 15 and 17, but the readout data line of the readout amplifier circuit therein is precharged to the level of voltage Vddp–Vth, not to sense power supply voltage Vdds in the structure of FIG. 30. The structure of sense amplifier circuit S/A provided corresponding to bit lines BL and ZBL is similar to that of the previous embodiments, and includes sense amplifier activation transistors TQ3 and TQ6, a pair of cross-coupled transistors TQ1 and TQ2, and a pair of cross-coupled transistors TQ4 and TQ5. The operation of reading out data in the write/read circuitry of FIG. 30 will be described with reference to the waveform diagram of FIG. 31.

The H level of column select signal CSL corresponds to the level of periphery power supply voltage Vddp.

It is assumed that bit line BL is now at the level sense power supply voltage Vdds and bit line ZBL is at the level of boosted sense ground voltage Vbsg. Column select signal CSL is at an L level, and column select gate CSG is at a non-conductive state. In data line precharge/equalize circuit IOEQ, data line equalize designation signal φIOEQ is at an H level, and all MOS transistors NQ1–NQ3 therein are on. Internal data lines IO and ZIO are precharged and equalized to the level of voltage Vddp−Vth.

In a data readout operation, data line equalize designation signal φIOEQ attains an L level at time T10, and the precharge/equalize operation on internal data lines IO and ZIO is completed. Then, column select signal CSL is pulled up to the level of periphery power supply voltage Vddp.

Bit line BL is maintained at the level of sense power supply voltage Vdds by sense amplifier circuit S/A. Therefore, transfer gate transistor TXa of column select gate CSG is off since gate-source voltage Vgs is equal to the threshold voltage Vth thereof. There is no charge transfer between bit line BL and the internal data line IO. Therefore, bit line BL maintains the level of sense power supply voltage Vdds, and internal data line IO maintains the level of voltage Vddp−Vth. Internal data line ZIO is reduced in voltage level since bit line ZBL is at the level of boosted sense ground voltage Vbsg and charge is discharged via N channel MOS transistors TQ2 and TQ3 of sense amplifier circuit S/A. In response to reduction of the voltage level of internal data line ZIO, the voltage of low level sense power supply line LPL increases. As a result, the voltage level of bit line ZBL also increases.

When the difference of the voltage levels between internal data lines IO and ZIO becomes large enough when column select signal CSL is at an L level, preamplifier activation signal PAE and column block select signal CBS are rendered active at predetermined timings. Responsively, data readout and amplification is carried out by readout amplifier circuit (preamplifier) PA, and the amplified data is transferred to the output circuit.

At time T11, column select signal CSL attains an L level, and data line precharge/equalize designation signal φIOEQ attains an H level. Internal data lines IO and ZIO are precharged/equalized to the level of voltage Vddp−Vth.

The amount of charge supplied to internal data line ZIO by data line precharge/equalize circuit IOEQ starting at time T11 is equal to the amount of charge discharged from internal data line ZIO to low level sense power supply line LPL via sense amplifier circuit S/A in a data readout operation. Therefore, even in the case where internal data lines IO and ZIO are precharged to a voltage level differing from the level of sense power supply voltage as shown in FIG. 30, the amount of charge supplied from periphery power supply line PPL to internal data lines IO and ZIO is monitored to draw out charge of an amount identical to the supplied charge amount according to the monitoring result in order to precharge internal data lines IO and ZIO to the level of a voltage Vddp−Vth. Thus, the voltage Vsan of low level sense power supply line LPL can be set to the level of boosted sense ground voltage Vbsg accurately.

Figure 31:
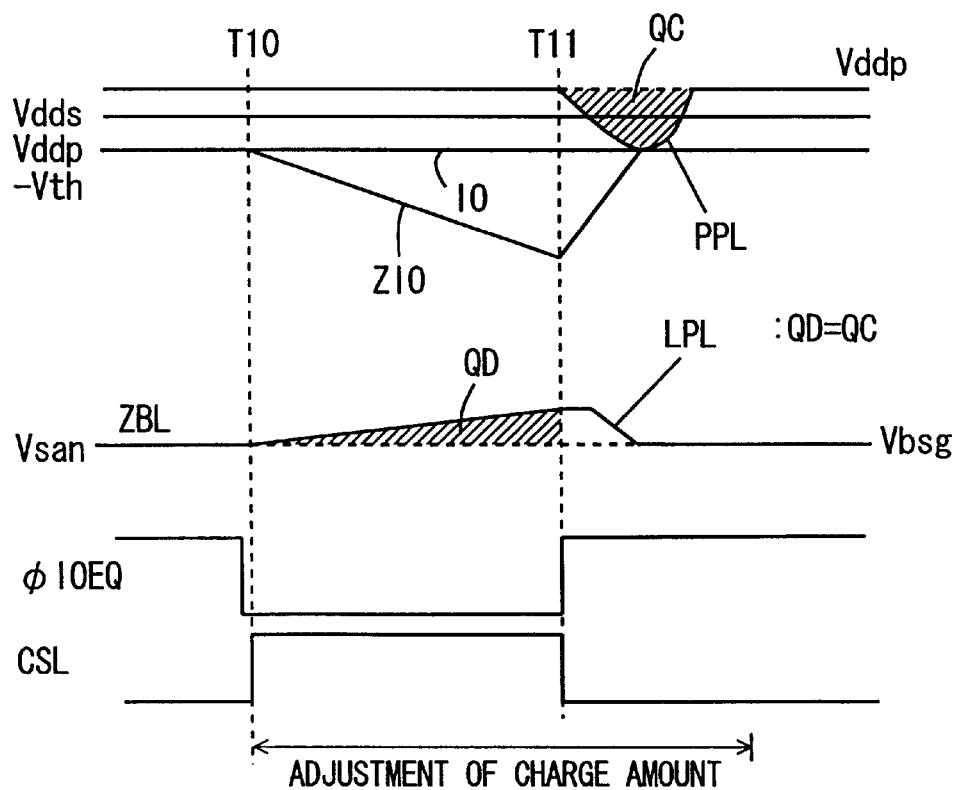
FIG. 31 is a signal waveform diagram representing the operation of the structure shown in FIG. 30.

The structure of preamplifier PA is identical to that shown in FIG. 15. Charge is supplied from periphery power supply line PPL to internal data line ZIO during operation of preamplifier PA (by operation of pull up circuit therein). In a precharge operation, the charge discharged towards low level sense power supply line LPL is compensated for to precharge internal data line ZIO to a voltage level lower than periphery power supply voltage Vddp by threshold voltage Vth. Therefore, QD=QC holds as shown in FIG. 31.

Figure 32:
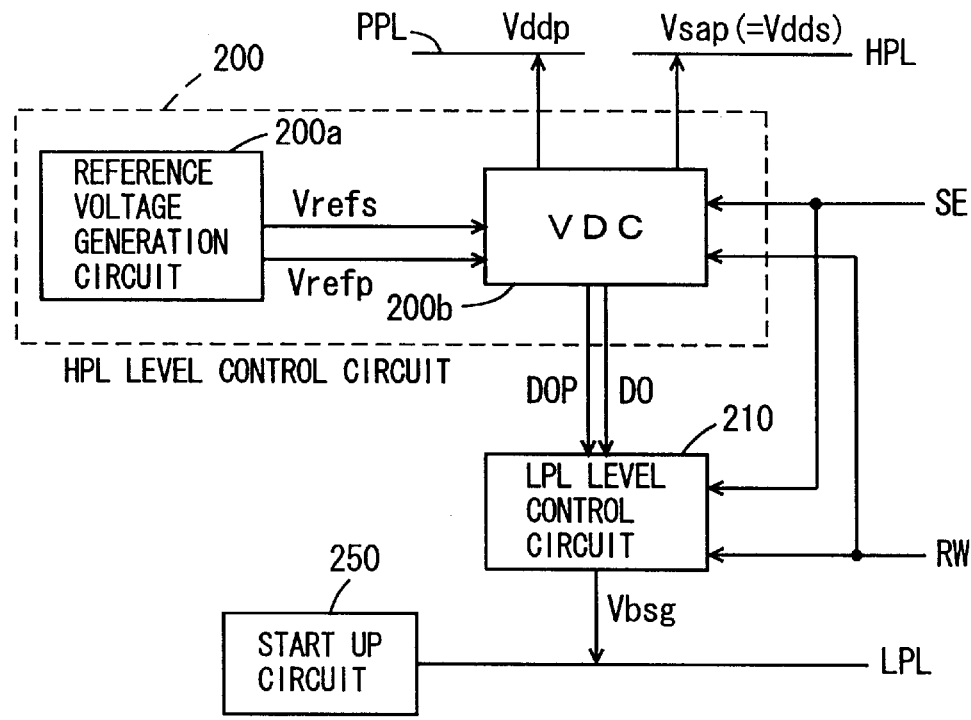
FIG. 32 schematically shows a structure of a sense power supply voltage control circuit according to a seventh embodiment of the present invention.

FIG. 32 schematically shows a structure of a sense power supply circuit according to the seventh embodiment of the present invention. Referring to FIG. 32, an HPL level control circuit 200 includes a reference voltage generation circuit 200a generating a reference voltage Vrefs for high level sense power supply line Vdds and a reference voltage Vrefp for periphery power supply voltage Vddp, and an internal voltage-down converter (VDC) 200b adjusting the voltage levels of high level sense power supply line HPL and periphery power supply line PLL to the levels of reference voltages Vrefs and Vrefp. Internal voltage-down converter 200b, whose structure will be described in detail afterwards, includes sets of a comparator and current drive transistor provided corresponding to high level sense power supply line HPL and periphery power supply line PPL, respectively. The comparator generates comparison result designation signals DO and DOP to control the corresponding current drive transistor.

LPL level control circuit 210 adjusts the voltage level of low level sense power supply line LPL according to the signals DO and DOP representing the comparison result generated from internal voltage-down converter 200b. LPL level control circuit 210 is rendered active when sensing operation activation signal SE and column access designation signal RW are active. Therefore, in a sensing operation, charge of an amount equal to the charge transfer amount of high level sense power supply line HPL is discharged from low level sense power supply line LPL by LPL level control circuit 210. In a column access operation, LPL level control circuit 210 discharges charge from low level sense power supply line LPL according to the monitoring result of the transfer charge amount of periphery power supply line PPL.

The low level sense power supply line is also provided with the startup circuit 250 for initializing the voltage on the low level sense power supply line upon power on or the like..

Figure 33:
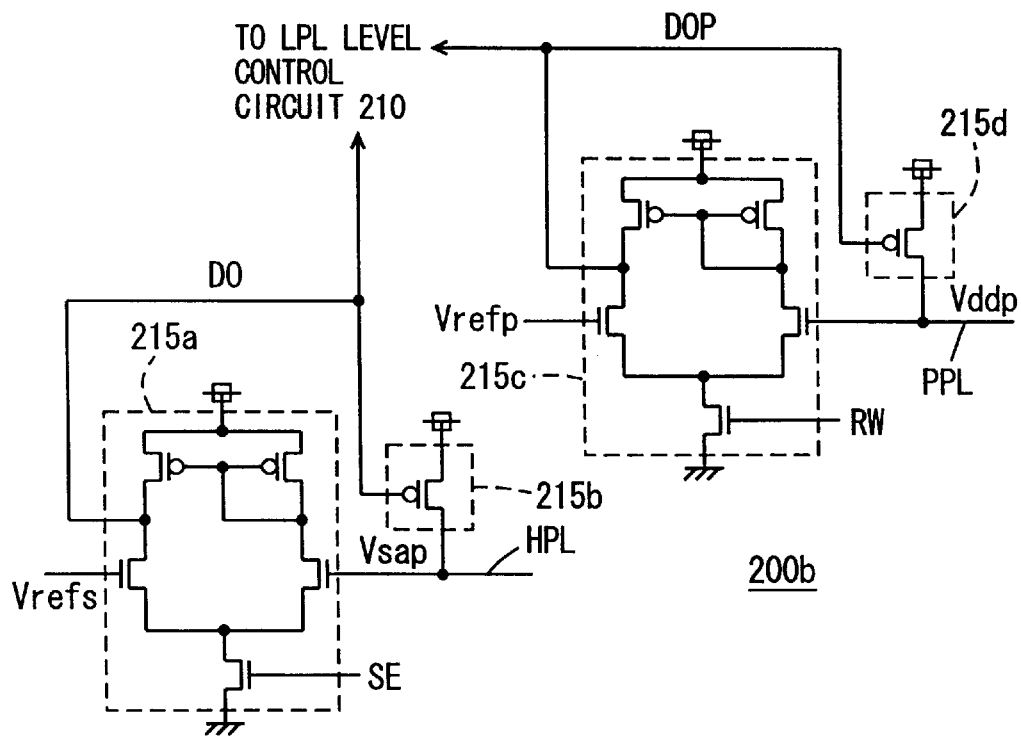
FIG. 33 shows a structure of an internal voltage-down converter of FIG. 32.

FIG. 33 shows an example of a structure of internal voltage-down converter 200b in HPL level control circuit 200 of FIG. 32. Referring to FIG. 33, internal voltage-down converter (VDC) 200b includes a comparator 215a rendered active, in response to activation of sensing operation activation signal SE, for comparing reference voltage Vrefs with the voltage on high level sense power supply line HPL to generate a signal DO indicating the comparison result, and a current drive transistor 215b supplying current from an external power supply node to high level sense power supply line HPL according to the output signal DO from comparator 215a. Current drive transistor 215b is formed of a P channel MOS transistor.

Internal voltage-down converter 200b further includes a comparator 215c rendered active, in response to activation of column access designation signal RW, to compare reference voltage Vrefp with voltage Vddp on periphery power supply line PPL, and a current drive transistor 215d supplying current from the external power supply node to periphery power supply line PPL according to a signal DOP outputted from comparator 215c.

Current drive transistor 215d is formed of a P channel MOS transistor.

Output signals DO and DOP from comparators 215a and 215c are applied to LPL level control circuit 210. The operations of comparators 215a and 215c and current drive transistors 215b and 215d are identical to those described in the previous first embodiment. By comparator 215a and current drive transistor 215b, the voltage level of high level sense power supply line HPL is set to the level of reference voltage Vrefs. By comparator 215c and current drive transistor 215d, voltage Vddp of periphery power supply line PPL is set to the voltage level of reference voltage Vrefp.

Figure 34:
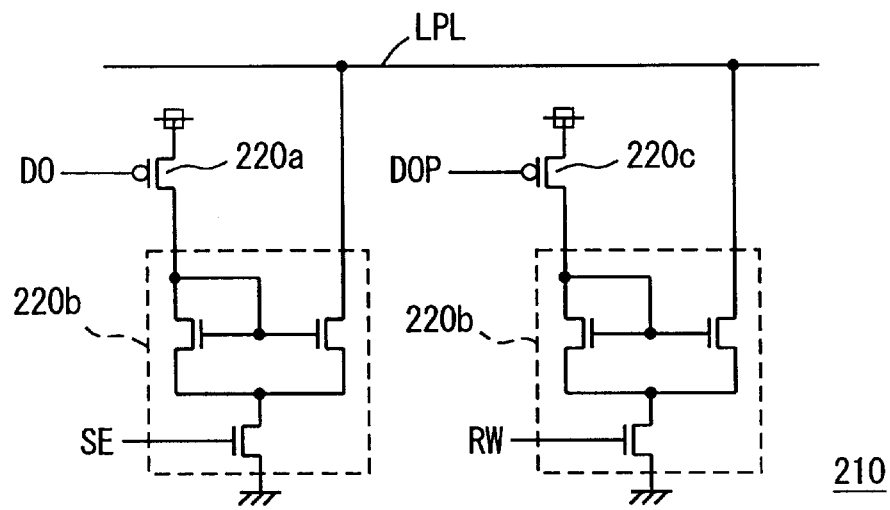
FIG. 34 shows a structure of an LPL level control circuit of FIG. 32.

FIG. 34 shows a structure of LPL level control circuit 210 shown in FIG. 32. Referring to FIG. 34, LPL level control circuit 210 includes a current monitor transistor 220a supplying current from the external power supply node according to output signal DO from comparator 215 shown in FIG. 33, and a current mirror stage 220b rendered active in response to activation of sensing operation activation signal SE to supply a mirror current of the current supplied by current monitor transistor 220a to the ground node from low level sense power supply line LPL. Current monitor transistor 220a is formed of a P channel MOS transistor. The ratio of current drivabilities (size; ratio of channel width to channel length) of current drive transistor 215b and current monitor transistor 220a of FIG. 33 is set to a reciprocal of the mirror ratio of current mirror stage 220b, and the relationship thereof is similar to that of the foregoing equation (7).

LPL level control circuit 210 further includes a current monitor transistor 220c supplying current from the external power supply node according to the signal DOP outputted from comparator 215c of FIG. 33, and a current mirror stage 220d responsive to activation of column access designation signal RW to conduct a mirror current of the current supplied by current monitor transistor 220c from low level sense power supply line LPL to the ground node. Current monitor transistor 220c is formed of a P channel MOS transistor. The ratio of the current drivabilities (ratio of channel width to channel length) of current drive transistor 215d and current monitor transistor 220c is set to be equal to a reciprocal of the mirror ratio of current mirror stage 220d. By appropriately adjusting the mirror ratio of current mirror stages 220b and 220d, charge of an amount identical to that supplied by current drive transistors 215b and 215d is discharged from low level sense power supply line LPL to the ground node according to signals DO and DOP outputted from comparators 215a and 215c of FIG. 33.

In the structure of FIG. 32, sensing operation activation signal SE is employed. However, the voltage level of high level sense power supply line HPL may be adjusted using a pulsive control signal PSE that is rendered active only during the period where the sensing operation is carried out, and accordingly, the voltage level of low level sense power supply line LPL may be adjusted.

The present seventh embodiment can have a capacitor provided to high level sense power supply line HPL, low level sense power supply line LPL and periphery power supply line PPL according to the PCAS scheme to compensate for each power supply voltage utilizing the charge of the capacitors. When the capacitor is used, start up circuit 250 shown in FIG. 32 is dispensable.

Start up circuit 250 sets the voltage level of low level sense power source voltage Vsan to the level of boosted sense ground voltage Vbsg at the time of the power on or in a standby state. In order to compensate for change in the voltage level of low level sense power source voltage Vsan in a standby state, the structure described in the previous third embodiment and the structure described with reference to FIGS. 10 and 11 can be employed.

According to the seventh embodiment of the present invention, in the structure in which the internal data line is precharged to a voltage level differing from the level of the sense power supply voltage, the amount of charge supplied to the sense power supply line and the internal data line is monitored to draw out an amount of charge corresponding to the monitoring result from the low level sense power supply line in a sensing operation and a column access operation, and the voltage level of the low level sense power supply line can be set accurately at a predetermined voltage level over the entire period.

Other Applications

In the above description, low level sense power source voltage Vsan is set to the level of the voltage Vbsg that is higher than ground voltage GND. In principle, the rise of the low level sense power supply voltage from the ground voltage level can be prevented even in the case where voltage Vbsg is set to ground voltage GND. Therefore, the present invention is applicable to a standard DRAM in which a low level sense power supply voltage is set to ground voltage GND, although a negative voltage should be used as one operating power supply voltage instead of the ground voltage in order to operate the current mirror in the LPL control circuit stably. Also, substrate bias voltage Vbb can be a negative voltage.

According to the present invention, the amount of charge supplied to the high level power supply line or periphery power supply line is monitored to draw out charge of an amount corresponding to the monitoring result from the low level sense power supply line. Therefore, change in the low level sense power supply voltage can be suppressed, and the low level sense power supply voltage can be maintained at a predetermined level stably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a first sense power source voltage supply line;
    a second sense power source voltage supply line;
    a plurality of memory cells arranged in rows and columns;
    a plurality of bit line pairs, provided corresponding to the respective columns, each connecting to memory cells on a corresponding column;
    sense amplifier circuits, provided corresponding to the bit line pairs, each receiving operating power supply voltages from the first and second sense power source voltage supply lines to differentially amplify voltage of a corresponding bit line pair when activated;
    a sense power supply circuit for comparing a reference voltage with a voltage of said first sense power source voltage supply line and transferring charge between said first sense power source voltage supply line and a first power supply node according to a comparison result; and
    a level control circuit for monitoring an amount of charge transferred by said sense power supply circuit and transferring charge, of an amount corresponding to a monitored amount of charge, between said second sense power source voltage supply line and a second power supply node.

2. The semiconductor memory device according to claim 1, wherein said sense power supply circuit comprises:
    a comparator for comparing said reference voltage with the voltage of said first sense power source voltage supply line to output a signal indicating a comparison result, and
    a first variable conductance element, coupled between said first power supply node and said first sense power source voltage supply node, having a conductance changed according to the output signal of said comparator, and transferring the charge between said first power supply node and said first sense power source voltage supply line according to the conductance thereof; and said level control circuit comprises a second variable conductance element having a conductance changed in accordance with to said output signal of said comparator, and a current mirror circuit coupled to said second variable conductance element, said second sense power source voltage supply line, and said second power supply node, for flowing, between said second sense power source voltage supply line and said second power supply node, a mirror current controlled by charge transferred via said second variable conductance element.

3. The semiconductor memory device according to claim 1, further comprising a power supply control circuit for activating said level control circuit for a predetermined period of time including a sense period in which said sense amplifier circuits carries out a sensing operation, and for activating said sense power supply circuit when said sense amplify circuits are in an active state.

4. The semiconductor memory device according to claim 1, further comprising a voltage adjust circuit, rendered active when said level control circuit is inactive, for comparing a second reference voltage with the voltage on said second sense power source voltage supply line to adjust a level of the voltage on said second sense power source voltage supply line according to a comparison result thereof.

5. The semiconductor memory device according to claim 1, wherein said first sense power source voltage supply line generates a voltage corresponding to a high level of data stored in said memory cell, and said second sense power source voltage supply line generates a voltage higher than ground potential and corresponding to a low level of data stored in said memory cell.

6. The semiconductor memory device according to claim 1, further comprising:

a capacitive element coupled to said second sense power source voltage supply line; and a switch circuit for isolating said capacitance element from said second power supply node when said sense amplifier circuits are active, and for coupling said capacitive element to said second power supply node when said sense amplifier circuits are inactive.

7. The semiconductor memory device according to claim 1, further comprising a readout amplifier circuit for amplifying data read out from a selected memory cell when active, wherein said level control circuit is rendered active when said readout amplifier circuit is active in an active period of the sense amplifier circuits.

8. The semiconductor memory device according to claim 7, further comprising:

a capacitive element coupled to said second sense power source voltage supply line; and a precharge circuit for coupling said second sense power source voltage supply line to said second power supply node when said sense amplifier circuits are inactive.

9. The semiconductor memory device according to claim 7, further comprising:

a capacitive element coupled to said first sense power source voltage supply line; and a precharge circuit for coupling said first sense power source voltage supply line to a third power supply node when said sense amplifier circuits are inactive.

10. The semiconductor memory device according to claim 1, further comprising a write drive circuit for transmitting write data to a selected memory cell when active, wherein said level control circuit is rendered active when said write drive circuit is active in an active period of said sense amplifier circuits.

11. The semiconductor memory device according to claim 10, further comprising:

a capacitive element coupled to said first sense power source voltage supply line; and a precharge circuit for coupling said first sense power source voltage supply line to a third power supply node when said sense amplifier circuits are inactive.

12. The semiconductor memory device according to claim 10, further comprising:

a capacitive element coupled to said second sense power source voltage supply line; and a precharge circuit for coupling said second sense power source voltage supply line to the second power supply node when said sense amplifier circuits are inactive.

13. The semiconductor memory device according to claim 1, further comprising:

a periphery power supply voltage transmission line;

an internal data line pair coupled to a selected column in a column select operation;

a voltage set circuit rendered active, when said column select operation is inactive, to set said internal data line pair to a level of a voltage level formed based on a voltage on said periphery power supply voltage transmission line;

a write/read circuit coupled to said internal data line pair, carrying out one of amplification of data on said internal data line pair and transfer of write data to said internal data line pair when active;

a periphery power supply circuit for comparing a second reference voltage with the voltage on said periphery power supply voltage transmission line to cause charge transfer between a fourth power supply node and said periphery power supply voltage transmission line according to a comparison result when said write/read circuit is active; and a second level control circuit, rendered active when said write/read circuit is active, for monitoring an amount of charge generated by said periphery power supply circuit to cause charge transfer corresponding to a monitored charge amount between said second sense power source voltage supply line and the second power supply node.

14. A semiconductor memory device comprising:

a plurality of memory cells arranged in rows and columns;

a plurality of bit line pairs, arranged corresponding to said columns, each connecting to memory cells of a corresponding column;

a first sense power source voltage supply line;

a second sense power source voltage supply line;

a plurality of sense amplifier circuits, provided corresponding to said plurality of bit line pairs and receiving, as operating power supply voltages, voltages on the first and second sense power source voltage supply lines,each for differentially amplifying voltages of a corresponding bit line pair when active;

an internal data line pair coupled to a bit line pair arranged corresponding to a selected column of said plurality of bit line pairs in a column select operation;

internal data producing circuitry coupled to said internal data line pair, for generating internal data when activated;

a sense power supply circuit rendered active, when said internal data producing circuitry is active, to compare the voltage on said first sense power source voltage supply line with a reference voltage for transferring charge between said first sense power source voltage supply line and a first power supply node according to a comparison result; and a level control circuit for monitoring an amount of charge transferred by said sense power supply circuit to transfer charge of an amount corresponding to a monitored charge amount between said second sense power source voltage supply line and a second power supply node.

15. The semiconductor memory device according to claim 14, wherein said internal data producing circuitry comprises a readout gate for coupling said internal data line pair to amplifier internal nodes when active, a readout amplifier for amplifying data on said amplifier internal nodes and latching an amplified data when active, and a driving circuit for setting a voltage level of said amplifier internal nodes to a voltage level equal to the voltage on said first sense power source voltage supply line, and said internal data producing circuitry comprises a write driver for setting said internal data line pair to levels of voltages of the first and second sense power supply source voltage supply lines according to write data when activated, respectively.

16. The semiconductor memory device according to claim 14, further comprising a voltage set circuit for setting said internal data line pair to a level of the voltage on said first sense power source voltage supply line.

17. The semiconductor memory device according to claim 14, further comprising control circuitry for rendering said sense power supply circuit active when the sense amplifier circuits are active.

18. The semiconductor memory device according to claim 14, wherein said first sense power source voltage supply line transmits a voltage corresponding to a high level of data stored in a memory cell of the memory cells, and said second sense power source voltage supply line transmits a voltage higher than a ground potential and corresponding to a low level of data stored in a memory cell of the memory cells.

19. The semiconductor memory device according to claim 14, further comprising:

a capacitive element coupled to said second sense power source voltage supply line; and a switch circuit for isolating said capacitive element from said second power supply node when the sense amplifier circuits are active, and for coupling said capacitive element to said second power supply node when said sense amplifier circuits are inactive.

20. The semiconductor memory device according to claim 14, further comprising a precharging circuit for precharging said internal data line pair to a voltage level different from the voltages on the first and second sense power source voltage supply lines when said internal data producing circuit is inactive.

* * * * *

UNITED STATES PATENT AND TRADEMARK OFFICE
CERTIFICATE OF CORRECTION

PATENT NO. : 6,314,028 B1
DATED : November 6, 2001
INVENTOR(S) : Takashi Kono

Page 1 of 1

It is certified that error appears in the above-identified patent and that said Letters Patent is hereby corrected as shown below:

<u>Title page,</u>
Item "[30], Foreign Application Priority Data", change "12-206786" to -- 2000-206786 --.

Signed and Sealed this

Second Day of April, 2002

Attest:

JAMES E. ROGAN
*Attesting Officer*     *Director of the United States Patent and Trademark Office*